(12) United States Patent
Yang et al.

(10) Patent No.: US 12,302,719 B2
(45) Date of Patent: May 13, 2025

(54) DISPLAY SUBSTRATE AND DISPLAY DEVICE

(71) Applicants: CHONGQING BOE DISPLAY TECHNOLOGY CO., LTD., Chongqing (CN); BOE TECHNOLOGY GROUP CO., LTD., Beijing (CN)

(72) Inventors: Ni Yang, Beijing (CN); Wei Zhang, Beijing (CN); Yue Long, Beijing (CN); Lili Du, Beijing (CN); Hai Zheng, Beijing (CN); Qiwei Wang, Beijing (CN)

(73) Assignees: CHONGQING BOE DISPLAY TECHNOLOGY CO., LTD., Chongqing (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 18/029,042

(22) PCT Filed: Apr. 27, 2022

(86) PCT No.: PCT/CN2022/089513
§ 371 (c)(1),
(2) Date: Mar. 28, 2023

(87) PCT Pub. No.: WO2023/206129
PCT Pub. Date: Nov. 2, 2023

(65) Prior Publication Data
US 2024/0365609 A1    Oct. 31, 2024

(51) Int. Cl.
*H10K 59/131*    (2023.01)
*G09G 3/3233*    (2016.01)
*H10K 59/126*    (2023.01)

(52) U.S. Cl.
CPC ......... *H10K 59/131* (2023.02); *G09G 3/3233* (2013.01); *H10K 59/126* (2023.02);
(Continued)

(58) Field of Classification Search
CPC ........... H10K 59/00–95; H10K 59/126; H10K 59/122; G09G 3/2003; G09G 2300/0452;
(Continued)

(56) References Cited

U.S. PATENT DOCUMENTS

2013/0043475 A1    2/2013    Kim et al.
2017/0053975 A1    2/2017    Cho et al.
(Continued)

FOREIGN PATENT DOCUMENTS

CN    105977307 A    9/2016
CN    106129076 A    11/2016
(Continued)

OTHER PUBLICATIONS

CN-112310125-A (Year: 2021).*
WO-2022062465-A1 (Year: 2022).*

*Primary Examiner* — Sanjiv D. Patel
(74) *Attorney, Agent, or Firm* — BROOKS KUSHMAN P.C.

(57) ABSTRACT

Display substrate and display device are provided. The display substrate includes: a base and sub-pixels thereon, the sub-pixel includes a light-emitting element and a sub-pixel driving circuit including a driving transistor and a compensation transistor; the compensation transistor has a first electrode coupled to a second electrode of the driving transistor, and a second electrode coupled to a gate electrode of the driving transistor; the compensation transistor includes a gate electrode and an active layer including a channel portion; the display substrate includes a pixel definition layer and shielding patterns, at least a portion of the
(Continued)

shielding pattern is located between the pixel definition layer and the gate electrode of the compensation transistor, and an orthographic projection of the shielding pattern onto the base at least partially overlaps with an orthographic projection of corresponding channel portion of the compensation transistor onto the base.

19 Claims, 16 Drawing Sheets

(52) U.S. Cl.
CPC ............... *G09G 2300/0426* (2013.01); *G09G 2300/0819* (2013.01); *G09G 2300/0842* (2013.01); *G09G 2300/0861* (2013.01); *G09G 2320/0233* (2013.01); *G09G 2320/045* (2013.01); *G09G 2330/021* (2013.01)

(58) Field of Classification Search
CPC ......... G09G 3/3614; G09G 2300/0426; G09G 2320/029; G09G 2320/0666; G09G 2380/02; G09G 3/3225; G09G 3/3648; G09G 2300/0465; G09G 2320/0209; G09G 2320/0233; G09G 2320/0242; G09G 2340/06; G09G 3/3607; G09G 3/3688; G09G 2300/0434; G09G 3/3208; G09G 2300/026; G09G 2320/0626; G09G 2320/066; G09G 2330/021; G09G 2330/06; G09G 3/32; G09G 2300/0404; G09G 2300/0447; G09G 2320/028; G09G 3/20; G09G 3/28; G09G 3/291; G09G 3/294; G09G 3/36; G09G 3/3655; G09G 3/3662; G09G 3/3677; G09G 5/003
See application file for complete search history.

(56) References Cited

U.S. PATENT DOCUMENTS

| | | | |
|---|---|---|---|
| 2017/0330927 A1* | 11/2017 | Lee | ................... H10K 59/1213 |
| 2022/0320213 A1 | 10/2022 | Shang et al. | |
| 2022/0320245 A1 | 10/2022 | Qu et al. | |
| 2022/0328570 A1 | 10/2022 | Shang et al. | |
| 2022/0376024 A1* | 11/2022 | Zheng | ................ H10K 59/1216 |
| 2023/0043145 A1* | 2/2023 | Yuan | .................... H10K 59/131 |
| 2023/0097504 A1 | 3/2023 | Liu et al. | |

FOREIGN PATENT DOCUMENTS

| | | | | |
|---|---|---|---|---|
| CN | 106469745 A | | 3/2017 | |
| CN | 107369690 A | | 11/2017 | |
| CN | 111599825 A | | 8/2020 | |
| CN | 112310125 A | * | 2/2021 | ........... G09G 3/3233 |
| CN | 112436042 A | | 3/2021 | |
| CN | 113257885 A | | 8/2021 | |
| CN | 113763883 A | | 12/2021 | |
| CN | 216980566 U | | 7/2022 | |
| JP | 2013012610 A | | 1/2013 | |
| KR | 20200016073 A | | 2/2020 | |
| WO | 2021184306 A1 | | 9/2021 | |
| WO | 2022041203 A1 | | 3/2022 | |
| WO | WO-2022062465 A1 | * | 3/2022 | ........... G09G 3/3233 |

\* cited by examiner

DISPLAY SUBSTRATE AND DISPLAY DEVICE

CROSS-REFERENCE TO RELATED APPLICATION

This application is the U.S. National Phase of PCT Application No. PCT/CN2022/089513 filed on Apr. 27, 2022, which is incorporated herein by reference in its entirety.

TECHNICAL FIELD

The present disclosure relates to the technical field of display, and in particular, to a display substrate and a display device.

BACKGROUND

In recent years, with the rapid development of the display industry, rigid liquid crystal screens gradually fail to meet various requirement of users, and there is an increasing need for the organic light-emitting diode display having flexible characteristics. The organic light-emitting diode display are widely used in various fields as it has various advantages such as good flexibility, lightness, low power consumption, fast response, wide viewing angle, and so on.

SUMMARY

The present disclosure is to provide a display substrate and a display device.

To achieve this, the present disclosure provides the following technical solutions.

In a first aspect of the present disclosure, a display substrate is provided, including a base and a plurality of sub-pixels provided on the base, where the sub-pixel includes a sub-pixel driving circuit and a light-emitting element, the sub-pixel driving circuit includes:

a driving transistor and a compensation transistor, the compensation transistor includes an active layer and a gate electrode, the active layer of the compensation transistor includes a first electrode, a second electrode, and a channel portion connecting the first electrode and the second electrode, the driving transistor includes an active layer and a gate electrode, and the active layer of the driving transistor includes a first electrode, a second electrode, and a channel portion connecting the first electrode and the second electrode;

the first electrode of the compensation transistor is coupled to the second electrode of the driving transistor, and the second electrode of the compensation transistor is coupled to the gate electrode of the driving transistor; the driving transistor is configured to drive the light-emitting element to emit light; and the display substrate further includes a pixel definition layer and a plurality of shielding patterns, at least a portion of the shielding pattern is located between the pixel definition layer and the gate electrode of the compensation transistor, and an orthographic projection of the shielding pattern onto the base at least partially overlaps with an orthographic projection of a channel portion of a corresponding compensation transistor onto the base.

Optionally, the channel portion of the compensation transistor includes a first channel sub-portion and a second channel sub-portion; the first channel sub-portion is coupled to the second electrode of the compensation transistor.

The orthographic projection of the shielding pattern onto the base at least partially overlaps with an orthographic projection of a corresponding first channel sub-portion onto the base.

Optionally, a length of the shielding pattern in a second direction is in a range from 1 micrometer to 20 micrometers, and a length of a portion of the first channel sub-portion covered by the shielding pattern in the second direction is greater than or equal to 0.5 micrometers.

Optionally, a ratio of an area where the shielding pattern overlapping with the orthographic projection of the corresponding first channel sub-portion onto the base, to an area of the first channel sub-portion is in a range from 0.025 to 1.

Optionally, the display substrate further includes a semiconductor layer, a first conductor layer, a second conductor layer, a first source-drain metal layer, a second source-drain metal layer, and a pixel definition layer which are sequentially stacked on the base in a direction away from the base; the active layer of the compensation transistor is located in the semiconductor layer and the gate electrode of the compensation transistor is located in the first conductor layer.

Optionally, the display substrate further includes a plurality of power supply lines, and the shielding pattern is coupled to the power supply line.

Optionally, the shielding pattern and the power supply line are formed as one-piece structure, and the power supply line is located in the second source-drain metal layer in the display substrate.

Optionally, the power supply line includes at least one portion extending in a first direction, and an orthographic projection of the at least one portion of the power supply line extending in the first direction onto the base at least partially overlaps with an orthographic projection of the channel portion of the driving transistor onto the base; the shielding pattern protrudes from the power supply line in a second direction, and the second direction intersects with the first direction.

Optionally, the display substrate further includes a plurality of screening patterns, and the screening pattern is coupled to a corresponding shielding pattern and the power supply line.

Optionally, the active layer of the compensation transistor further includes a first channel sub-portion, a second channel sub-portion, and a channel connection portion, and the channel connection portion is coupled to the first channel sub-portion and the second channel sub-portion.

An orthographic projection of the screening pattern onto the base at least partially overlaps with an orthographic projection of a corresponding channel connection portion onto the base.

Optionally, the orthographic projection of the shielding pattern onto the base at least partially overlaps with the orthographic projection of the corresponding channel connection portion onto the base.

Optionally, there is an overlapping region between the orthographic projection of the screening pattern onto the base and an orthographic projection of a corresponding shielding pattern onto the base, the shielding pattern is coupled to the shielding pattern by a via hole in the overlapping region, and at least a portion of the orthographic projection of the channel connection portion onto the base is located in the overlapping region.

Optionally, the screening pattern is located in the second conductor layer in the display substrate, and the shielding pattern is located in the first source-drain metal layer in the display substrate.

Optionally, the display substrate further includes a plurality of first initialization signal lines, and the shielding pattern is coupled to the first initialization signal line.

Optionally, the sub-pixel driving circuit further includes a first conductive connection portion and a first reset transistor; the first conductive connection portion is coupled to the first initialization signal line, the shielding pattern, and a first electrode of the first reset transistor; a second electrode of the first reset transistor is coupled to the gate electrode of the driving transistor.

Optionally, the shielding pattern and the first conductive connection portion coupled to the shielding pattern are formed as one-piece structure, and the first conductive connection portion is located in the first source-drain metal layer in the display substrate.

Optionally, the active layer of the compensation transistor further includes a first channel sub-portion, a second channel sub-portion, and a channel connection portion, and the channel connection portion is coupled to the first channel sub-portion and the second channel sub-portion.

An orthographic projection of the first initialization signal line onto the base at least partially overlaps with an orthographic projection of a corresponding channel connection portion onto the base.

Optionally, the first initialization signal line includes a main body portion extending in a second direction and a protruding portion protruding from the main body portion in a first direction.

An orthographic projection of the protruding portion onto the base at least partially overlaps with an orthographic projection of a corresponding channel connection portion onto the base.

Optionally, the display substrate includes a plurality of power supply lines, a plurality of light-emitting control lines, a plurality of gate lines, a plurality of data lines, a plurality of reset lines, a plurality of first initialization signal lines, and a plurality of second initialization signal lines.

The sub-pixel driving circuit further includes: a storage capacitor, a first reset transistor, a data writing transistor, a power supply control transistor, a light-emitting control transistor, and a second reset transistor.

A gate electrode of the first reset transistor is coupled to a corresponding reset line, a first electrode of the first reset transistor is coupled to a corresponding first initialization signal line, and a second electrode of the first reset transistor is coupled to the gate electrode of the driving transistor.

A gate electrode of the data writing transistor is coupled to a corresponding gate line, a first electrode of the data writing transistor is coupled to a corresponding data line, and a second electrode of the data writing transistor is coupled to the first electrode of the driving transistor.

A gate electrode of the power supply control transistor is coupled to a corresponding light-emitting control line, a first electrode of the power supply control transistor is coupled to a corresponding power supply line, and a second electrode of the power supply control transistor is coupled to the first electrode of the driving transistor.

A gate electrode of the light-emitting control transistor is coupled to the corresponding light-emitting control line, a first electrode of the light-emitting control transistor is coupled to the second electrode of the driving transistor, and a second electrode of the light-emitting control transistor is coupled to a corresponding light-emitting element.

A gate electrode of the second reset transistor is coupled to a corresponding reset line, a first electrode of the second reset transistor is coupled to a corresponding second initialization signal line, and a second electrode of the second reset transistor is coupled to the corresponding light-emitting element.

A first plate of the storage capacitor is coupled to the gate electrode of the driving transistor, and a second plate of the storage capacitor is coupled to the corresponding power supply line.

Based on the technical solution of the display substrate as described above, in a second aspect of the present disclosure, a display device is provided, including the above-mentioned display substrate.

BRIEF DESCRIPTION OF THE DRAWINGS

The drawings described herein are intended to provide a further understanding of the present disclosure and constitute a portion of the present disclosure, and exemplary embodiments and descriptions thereof in the present disclosure are used to explain the present disclosure and do not constitute an improper limitation on the present disclosure.

DETAILED DESCRIPTION

Figure 1:
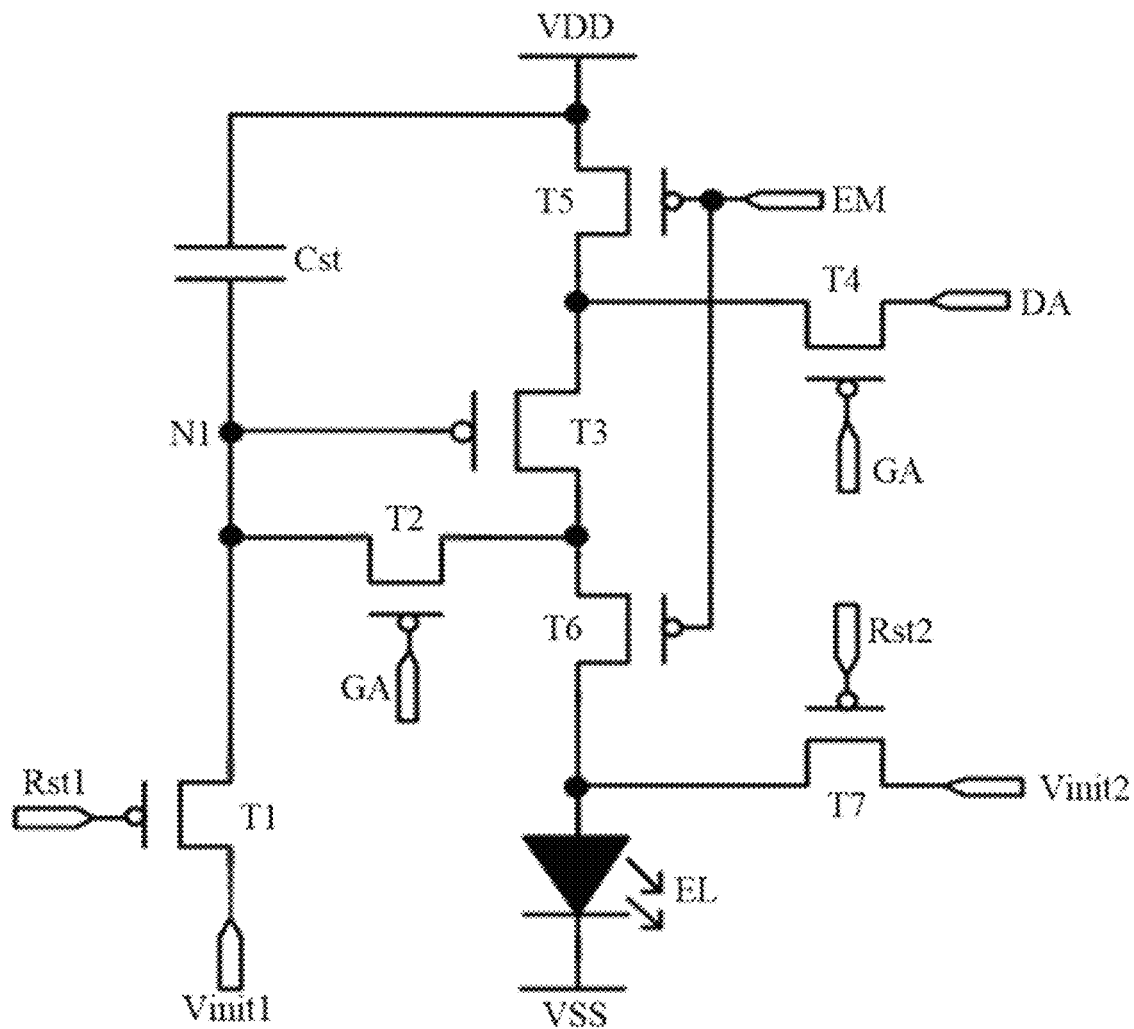
FIG. 1 is a circuit structure diagram of a sub-pixel driving circuit provided in an embodiment of the present disclosure.

To further explain the display substrate and the display device provided by embodiments of the present disclosure, a detailed description will be made in conjunction with the accompanying drawings.

The organic light-emitting diode display panel generally includes a sub-pixel driving circuit, and the performance of other transistors in the sub-pixel driving circuit which are connected with a driving transistor can directly affect the stability of a voltage at N1 node coupled to the driving transistor, and the stability of the voltage at the N1 node is critical to the display quality of the display panel. If leakage current of the other transistors is too large, the display panel may suffer from undesirable phenomena such as residual images and flicker. Therefore, the performance of the other transistors coupled to the driving transistor is to be ensured.

The present disclosure provides a display substrate, including: a base and multiple sub-pixels provided on the base, the sub-pixel includes a sub-pixel driving circuit. The sub-pixel driving circuit includes a driving transistor and a compensation transistor, a first electrode of the compensation transistor is coupled to a second electrode of the driving transistor, and a second electrode of the compensation transistor is coupled to a gate electrode of the driving transistor. The compensation transistor includes a channel portion. The display substrate further includes an anode layer, and an orthographic projection of the anode layer onto the base at least partially overlaps with an orthographic projection of a channel portion of a corresponding compensation transistor onto the base.

The inventor has found that the compensation transistor is a key transistor affecting the N1 node, and the leakage characteristic of the compensation transistor directly affects the stability of the voltage at the N1 node. Therefore, in the display substrate provided by the present disclosure, by arranging the orthographic projection of the anode layer onto the base to be at least partially overlapped with the orthographic projection of the channel portion of the corresponding compensation transistor onto the base, the channel portion of the compensation transistor can be shield by the anode layer, and the photo-induced leakage current of the compensation transistor produced by the channel portion being irradiated by light can be reduced, and the influence of the compensation transistor on the stability of the voltage at the N1 node due to the leakage current can be reduced.

However, the display substrate also has the following disadvantages.

(1). When the display product adopts a tandem EL device structure, pixel isolation pillars are provided therein. In a case where the pixel definition layer between adjacent sub-pixels has a recess and a pixel isolation pillar is provided therein, the existence of an anode at the recess of the pixel definition layer between the sub-pixels would directly cause light-emitting at a place where the light-emitting is not expected, resulting in a defect. If the recess of the pixel definition layer avoids the position of the anode shielding the compensation transistor, the isolation pillar may have a range not large enough to achieve the function of isolating the adjacent sub-pixels. It should be noted that the Tandem EL refers to a tandem light-emitting device. Currently, the device with lower luminance generally adopts a device structure having a single-layer for light-emitting. In order to improve the luminance and lifetime, the device can be stacked to make a tandem device, which changes from the single layer for light-emitting to multi-layers for light-emitting. The luminance can be improved, and the lifetime of the device can be significantly improved under the same luminance.

(2). When the resolution of the display product is improved, and when the anodes for the same row of pixels are used to shield the channel of the compensation transistor in a corresponding row of sub-pixel driving circuits, there may be a case where the anode space does not meet the process requirements. If the anode is adopted to shield the channel of the compensation transistor, there may be a case where the adjacent anodes are short-circuited, or a case where the compensation transistor near the boundary of the display region lacks shielding. Particularly, when the display product adopts FDC technology, since there is compression in the horizontal and vertical directions of the pixel, the anode space is seriously insufficient for the shielding for the channel of the compensation transistor by the anode.

(3). In a direction perpendicular to the substrate of the display substrate, the distance between the anode and the channel of the compensation transistor is relatively long. If the anode is adopted to shield the channel of the compensation transistor, the light shielding ability of the anode may be relatively weak, and the influence range of light diffraction on the channel may be relatively large.

(4). The material of the anode is generally ITO/Ag/ITO which are arranged in a stack, such material has a property of high reflectivity. When the anode is used for shielding, the area of the anode generally increases. For the display product with an under-screen fingerprint recognition that has certain requirement for the external light transmittance, if the anode is used for shielding the channel of the compensation transistor, the transmittance of the display product is low, and thus is not favorable for the realization of the fingerprint recognition function.

Based on the above disadvantages, with reference to FIGS. 1 to 4, FIG. 5, FIG. 12, and FIGS. 18 to 31, an embodiment of the present disclosure provides a display substrate, including a base 50 and multiple sub-pixels provided on the base 50; the sub-pixel includes a sub-pixel driving circuit and a light-emitting element, the sub-pixel driving circuit includes a driving transistor T3 and a compensation transistor T2.

The compensation transistor T2 includes an active layer 21 and a gate electrode, the active layer 21 of the compensation transistor includes a first electrode, a second electrode, and a channel portion connecting the first electrode and the second electrode. The driving transistor T3 includes an active layer 22 and a gate electrode, and the active layer 22 of the driving transistor T3 includes a first electrode, a second electrode, and a channel portion connecting the first electrode and the second electrode.

The first electrode of the compensation transistor T2 is coupled to the second electrode of the driving transistor T3, and the second electrode of the compensation transistor T2 is coupled to the gate electrode of the driving transistor T3; the driving transistor T3 is configured to drive the light-emitting element to emit light.

The display substrate further includes a pixel definition layer and multiple shielding patterns 30, at least a portion of the shielding patterns 30 is located between the pixel definition layer and the gate electrode of the compensation transistor T2, and an orthographic projection of the shielding pattern 30 onto the base 50 at least partially overlaps with an orthographic projection of a channel portion (for example, the first channel sub-portion 210) of a corresponding compensation transistor onto the base 50.

Illustratively, the display substrate includes multiple sub-pixels, and multiple sub-pixel driving circuits included in the multiple sub-pixels are arranged in an array. The multiple sub-pixel driving circuits are divided into multiple rows of sub-pixel driving circuits and multiple columns of sub-pixel driving circuits. The multiple rows of sub-pixel driving circuits are arranged along the first direction, and each row of sub-pixel driving circuit includes multiple sub-pixel driving circuits arranged along the second direction. The multiple columns of sub-pixel driving circuits are arranged along the second direction, and each column of sub-pixel driving circuits includes multiple sub-pixel driving circuits arranged along the first direction. Illustratively, the first direction intersects with the second direction. For example, the first direction includes a longitudinal direction, and the second direction includes a transverse direction.

Illustratively, the sub-pixel includes a sub-pixel driving circuit and a light-emitting element. The sub-pixel driving circuit is coupled to an anode of the light-emitting element for providing a driving signal to the light-emitting element to drive the light-emitting element to emit light.

Illustratively, the sub-pixel driving circuit may adopt 7T1C (i.e., 7 transistors and one capacitor), but is not limited thereto.

Illustratively, an orthographic projection of the channel portion of the compensation transistor T2 onto the base 50 at least partially overlaps with an orthographic projection of the gate electrode of the compensation transistor onto the base 50. Orthographic projections of the first and second electrodes of the compensation transistor T2 onto the base 50 do not overlap with the orthographic projection of the gate electrode of the compensation transistor T2 onto the base 50. The first and second electrodes of the compensation transistor T2 have a better conductivity than that of the channel portion of the compensation transistor T2.

Illustratively, an orthographic projection of the channel portion of the driving transistor T3 onto the base 50 at least partially overlaps with an orthographic projection of the gate electrode of the driving transistor onto the base 50. Orthographic projections of the first and second electrodes of the driving transistor T3 onto the base 50 do not overlap with the orthographic projection of the gate electrode of the driving transistor T2 onto the base 50. The first and second electrodes of the driving transistor T3 have a better conductivity than that of the channel portion of the driving transistor T3.

Illustratively, the second electrode of the compensation transistor T2 is coupled to the gate electrode of the driving transistor T3, the location where the second electrode of the compensation transistor T2 is coupled to the gate electrode of the driving transistor T3 forms an N1 node.

Illustratively, the display substrate further includes a pixel definition layer, and the pixel definition layer can define multiple pixel aperture regions. The display substrate further includes a light-emitting functional layer, and at least a portion of light-emitting functional layer is formed in the pixel aperture region.

Illustratively, in fabricating the display substrate, the shielding layer is formed at first and then the pixel definition layer is fabricated on a side of the shielding layer facing away from the base 50.

Illustratively, the orthographic projection of the shielding pattern 30 onto the base 50 at least partially overlaps with the orthographic projection of the channel portion of the corresponding compensation transistor T2 onto the base 50. Illustratively, the orthographic projection of the shielding pattern 30 onto the base 50 completely covers the orthographic projection of the channel portion of the corresponding compensation transistor T2 onto the base 50.

It can be seen from the specific structure of the display substrate that the display substrate provided by the embodiments of the present disclosure can achieve the following technical effects.

Effect 1: the shielding pattern 30 is located between the pixel definition layer and the gate electrode of the compensation transistor T2, the shielding pattern 30 does not affect the design of the pixel isolation pillar, and can achieve a good shielding for the channel portion of the compensation transistor T2 while maximize the range of the pixel isolation pillar between sub-pixels, thereby effectively ensuring the stability of the voltage at the N1 node.

Effect 2: when the resolution of the display product is improved, using the shielding pattern 30 to shield the channel portion of the compensation transistor T2 will not influence on the anode space, thereby avoiding the case where adjacent anodes are short-circuited. In addition, the lacking shielding of the compensation transistor T2 near the boundary of the display region can be addressed. Even if there is compression in horizontal and vertical directions of the pixel when the display product adopts FDC technology, the anode space requirement can also be ensured.

Effect 3: the channel portion of the compensation transistor T2 is located between the gate electrode of the compensation transistor T2 and the base 50, and the shielding pattern 30 is located between the pixel definition layer and the gate electrode of the compensation transistor T2, so that the distance between the shielding pattern 30 and the channel portion of the compensation transistor T2 in a direction perpendicular to the base 50 is short. By arranging the orthographic projection of the shielding pattern 30 onto the base 50 to be at least partially overlapped with the orthographic projection of the channel portion of the corresponding compensation transistor T2 onto the base 50, an effective shielding can be formed for the channel portion of the compensation transistor T2, reducing the range of light diffraction affecting the channel portion of the compensation transistor T2.

Effect 4: the shielding pattern 30 is used to shield the channel portion of the compensation transistor T2 without increasing the area of the anode. For the display product with under-screen fingerprint recognition which has certain requirements for the external light transmittance, the shielding pattern 30 is used for shielding the channel portion of the compensation transistor T2 so as to ensure the transmittance of the display product, which is beneficial to the realization of the fingerprint recognition function.

Effect 5: by shielding the channel portion of the compensation transistor T2 with the shielding pattern 30, the photo-induced leakage current of the compensation transistor T2 due to the channel portion being irradiated by the light can be reduced or eliminated, and thus the influence of the compensation transistor T2 on the stability of the voltage at the N1 node due to the leakage current can be e reduced or eliminated.

With reference to FIGS. 1 to 4, FIG. 5, FIG. 12, and FIGS. 18 to 31, in some embodiments, the channel portion of the compensation transistor T2 includes a first channel sub-portion 210 and a second channel sub-portion 211. The first channel sub-portion 210 is coupled to the second electrode of the compensation transistor T2.

The orthographic projection of the shielding pattern 30 onto the base 50 at least partially overlaps with an orthographic projection of a corresponding first channel sub-portion 210 onto the base 50.

Illustratively, the compensation transistor T2 includes a double gate electrode transistor, which includes a first channel sub-portion 210 and a second channel sub-portion 211. The active layer 21 of the compensation transistor further includes a channel connection portion for connecting the first channel sub-portion 210 and the second channel sub-portion 211.

Illustratively, the first channel sub-portion 210 is adjacent to the second electrode of the compensation transistor T2, and the second channel sub-portion 211 is adjacent to the first electrode of the compensation transistor T2.

Illustratively, the first channel sub-portion 210 is adjacent to the second electrode of the compensation transistor T2, i.e., the first channel sub-portion 210 is adjacent to the N1 node, and thus has a greater influence on the stability of the N1 node.

Illustratively, an orthographic projection of the shielding pattern 30 onto the base 50 at least partially overlaps with an orthographic projection of a corresponding first channel sub-portion 210 onto the base 50. Illustratively, the orthographic projection of the shielding pattern 30 onto the base 50 covers the orthographic projection of the corresponding first channel sub-portion 210 onto the base 50. Illustratively, an area of the orthographic projection of the shielding pattern 30 onto the base 50 is greater than an area of the orthographic projection of the first channel sub-portion 210 on the base 50.

Illustratively, the orthographic projection of the shielding pattern 30 onto the base 50 at least partially overlaps with an orthographic projection of a corresponding second channel sub-portion 211 onto the base 50. Illustratively, the orthographic projection of the shielding pattern 30 onto the base 50 covers an orthographic projection of the corresponding second channel sub-portion 211 onto the base 50. Illustratively, the area of the orthographic projection of the shielding pattern 30 onto the base 50 is greater than an area of the orthographic projection of the second channel sub-portion 211 onto the base 50.

In the display substrate provided in the above-mentioned embodiments, by arranging that the orthographic projection of the shielding pattern 30 onto the base 50 to be at least partially overlaps with the orthographic projection of the corresponding first channel sub-portion 210 onto the base 50, the photo-induced leakage current of the compensation transistor T2 due to the channel portion being irradiated by sunlight can be reduced, and the influence of the compensation transistor T2 on the stability of the voltage at the N1 node due to the leakage current can be reduced.

In some embodiments, a length of the shielding pattern 30 in a second direction ranges from 1 micrometer to 20 micrometers, and a length of a portion of the first channel sub-portion 210 covered by the shielding pattern 30 in the second direction is greater than or equal to 0.5 micrometers.

In the display substrate provided in the above-mentioned embodiments, by arranging that the length of the shielding pattern 30 in the second direction to be between 1 micrometer and 20 micrometers, and the length of the portion of the first channel sub-portion 210 covered by the shielding pattern 30 in the second direction to be greater than or equal to 0.5 micrometers, the photo-induced leakage current of the compensation transistor T2 due to the channel portion being irradiated by sunlight can be reduced, and the influence of the compensation transistor T2 on the stability of the voltage at the N1 node due to the leakage current can be reduced.

In some embodiments, a ratio of an area where the shielding pattern 30 overlapping with the orthographic projection of a corresponding first channel sub-portion 210 onto the base to an area of the first channel sub-portion 210 is arranged to be within a range from 0.025 to 1.

The above-mentioned arrangement reduces the photo-induced leakage current of the compensation transistor T2 due to the channel portion being irradiated by sunlight, and reduces the influence of the compensation transistor T2 on the stability of the voltage at the N1 node due to the leakage current.

In some embodiments, the display substrate further includes a semiconductor layer, a first conductor layer, a second conductor layer, a first source-drain metal layer, a second source-drain metal layer, and a pixel definition layer which are sequentially stacked on the base 50 in a direction away from the base 50. The active layer 21 of the compensation transistor T2 is located in the semiconductor layer and the gate electrode of the compensation transistor is located in the first conductor layer.

Figure 12:
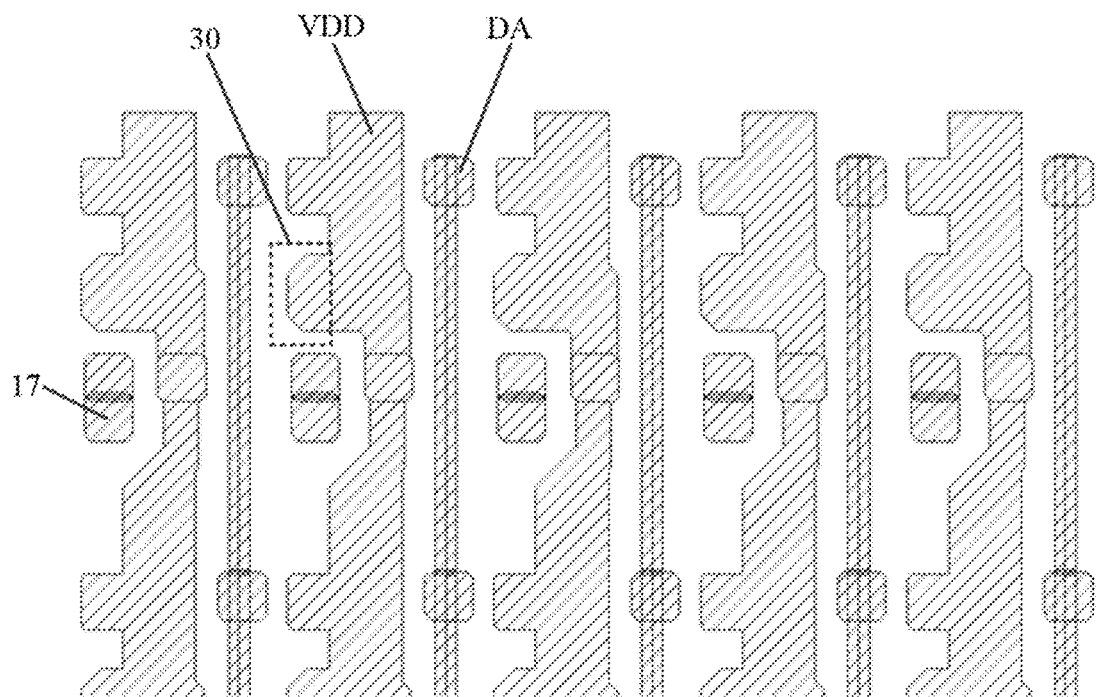
FIG. 12 is a schematic diagram showing a layout of a second source-drain metal layer in FIG. 2.
Figure 26:
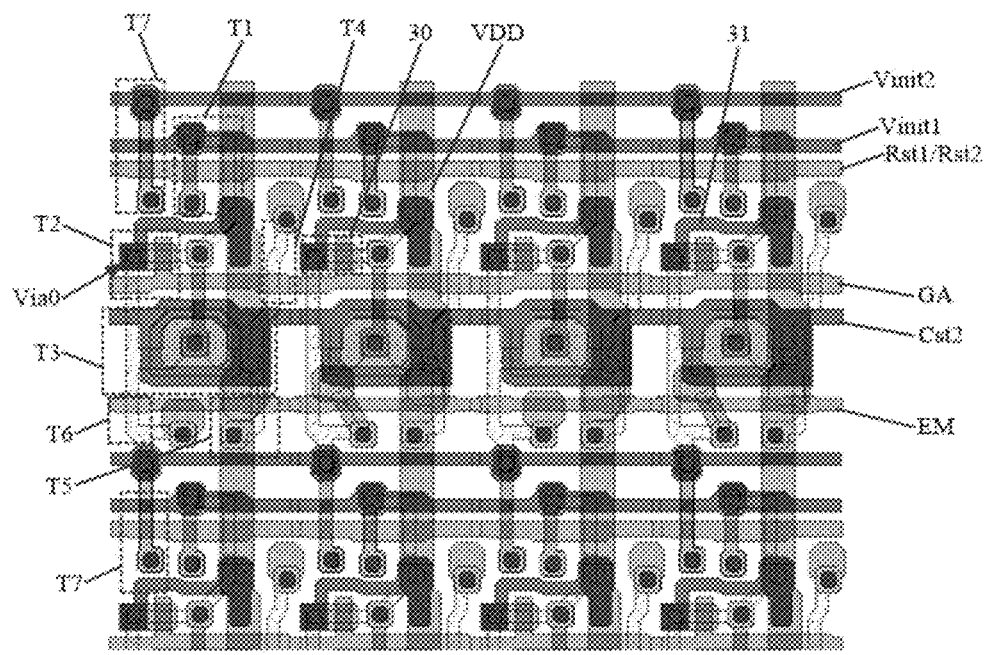
FIG. 26 is a schematic diagram showing the layout of FIG. 24 with a second source-drain metal layer being removed.
Figure 28:
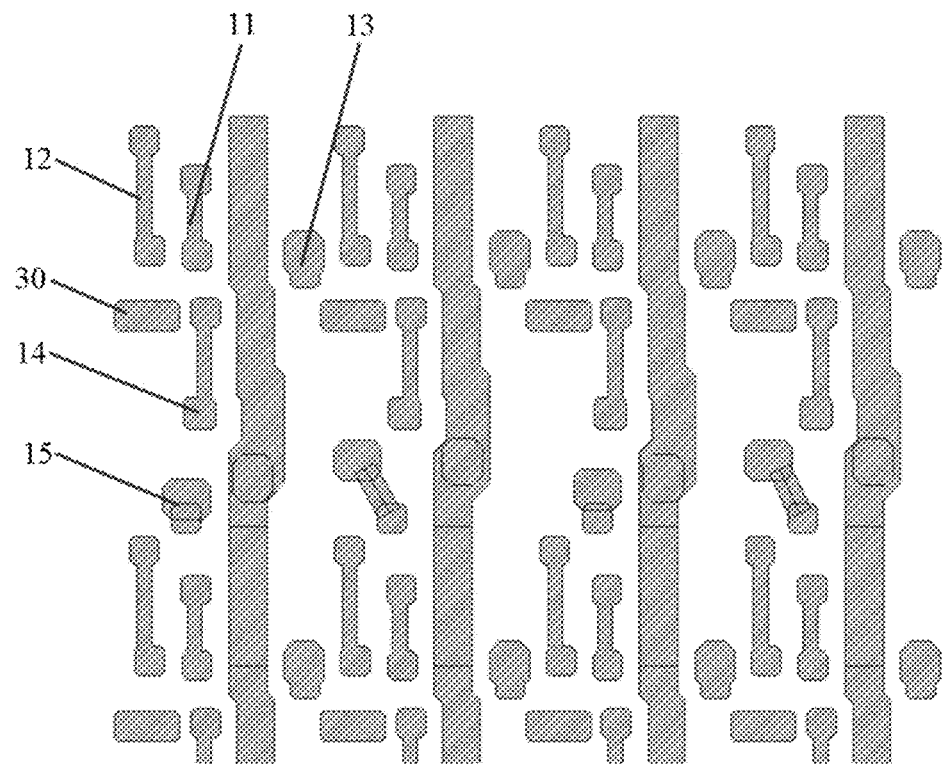
FIG. 28 is a schematic diagram showing a layout of a first source-drain metal layer of FIG. 23.
Figure 29:
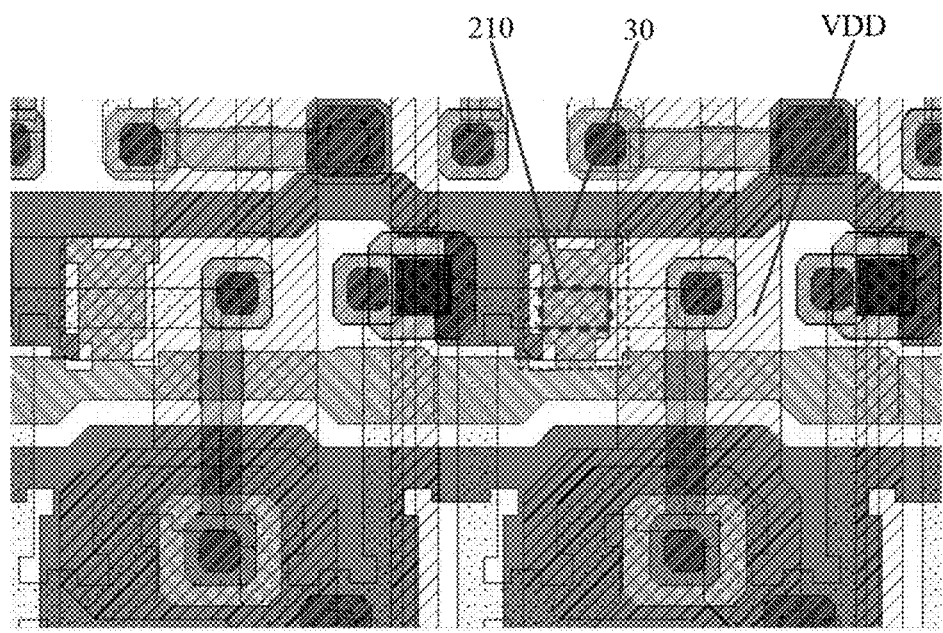
FIG. 29 is a schematic enlarged view of a portion X1 in FIG. 3.
Figure 30:
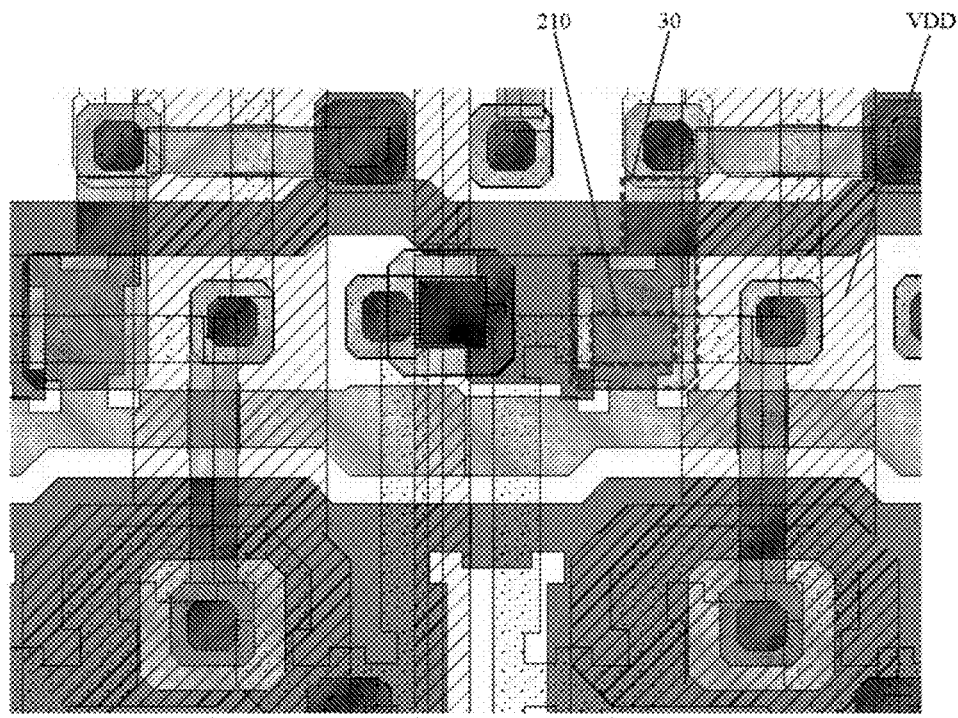
FIG. 30 is a schematic enlarged view of a portion X2 in FIG. 19.
Figure 31:
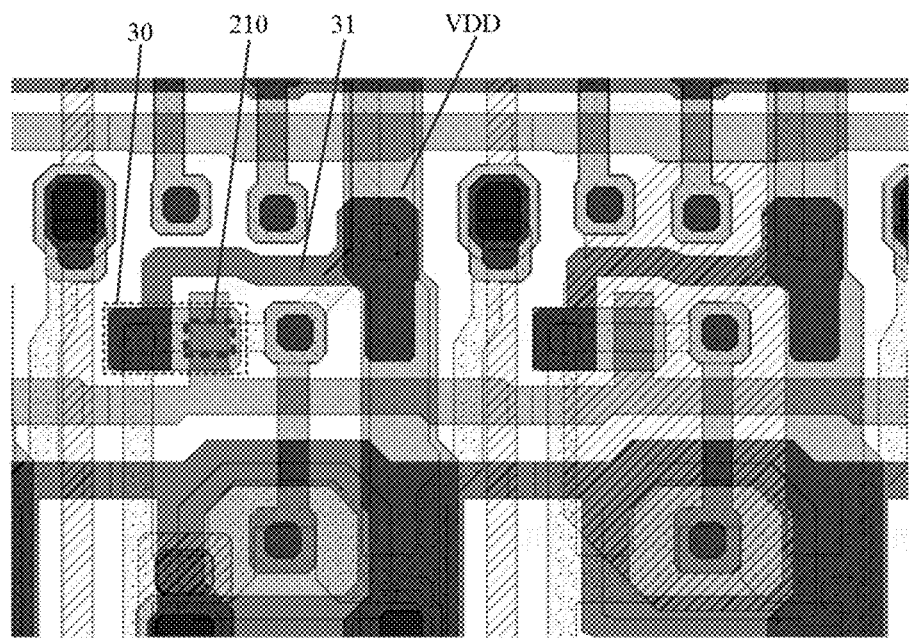
FIG. 31 is a schematic enlarged view of a portion X3 in FIG. 24.

As shown in FIGS. 12, 26, and 28, in some embodiments, the display substrate further includes multiple power supply lines VDD, and the shielding pattern 30 is coupled to the power supply line VDD.

Illustratively, the power supply line VDD includes at least a portion extending in the first direction, and the multiple power supply lines VDD are arranged along the second direction. The multiple power supply lines VDD are in one-to-one correspondence to the multiple columns of sub-pixel driving circuits, and the power supply line VDD is coupled to each sub-pixel driving circuit in a column of sub-pixel driving circuits corresponding to that power supply line VDD.

Illustratively, the power supply line VDD is configured to transmit a power supply signal with a constant voltage.

In the display substrate provided in the above-mentioned embodiments, by arranging the shielding pattern 30 to be coupled to the power supply line VDD, the shielding pattern 30 not only can shield the channel portion of the compensation transistor T2 to improve the stability of the N1 node, but also can have a constant potential, so as to avoid a fluctuation in the characteristic the compensation transistor T2 caused by a coupling when other signals fluctuate.

As shown in FIG. 12, in some embodiments, the shielding pattern 30 and the power supply line VDD are arranged to be one-piece structure, and the power supply line VDD is located in the second source-drain metal layer in the display substrate.

The above-mentioned arrangement not only enables the shielding pattern 30 to have the same constant potential as the power supply line VDD, but also ensures that the shielding pattern 30 can be formed in the same patterning process as the power supply line VDD at the same time, thereby simplifying the manufacturing process flow of the display substrate while ensuring the reliability and stability of the electrical connection between the shielding pattern 30 and the power supply line VDD.

As shown in FIG. 12, in some embodiments, the power supply line VDD is arranged to include at least a portion extending in a first direction, and an orthographic projection of at least the portion of the power supply line VDD extending in the first direction onto the base 50 at least partially overlaps with an orthographic projection of a channel portion of the driving transistor T3 onto the base 50. The shielding pattern 30 protrudes from the power supply line VDD along the second direction, and the second direction intersects with the first direction.

The above-mentioned arrangement can reduce a layout space occupied by the power supply line VDD and the shielding pattern 30 to a large extent, and effectively reduce a difficulty in designing the layout of the power supply line VDD and the shielding pattern 30.

As shown in FIG. 12, in some embodiments, the shielding pattern 50 and the power supply line VDD are located in the second source-drain metal layer in the display substrate, i.e., the shielding pattern 30 is fabricated by using the second source-drain metal layer in the display substrate.

The second source-drain metal layer in the display substrate is located between the pixel definition layer and the base 50, and the second source-drain metal layer adopts an opaque metal material. By using the second source-drain metal layer to form the shielding pattern 30, e the shielding effect of the shielding pattern 30 on the channel portion of the compensation transistor T2 can be ensured, which effectively reduce the optical leakage current caused by the channel portion of the compensation transistor T2 being subjected to front light diffraction or lateral light reflection, thereby maintaining the stability of the voltage at the N1 node and reducing the risk of occurrence of undesirable display residual images and flickers.

As shown in FIGS. 23 to 28 and 31, in some embodiments, the display substrate is arranged to further include multiple screening pattern 31, and the screening pattern 31 is coupled to a corresponding shielding pattern 30 and to the power supply line VDD.

Illustratively, the shielding pattern 30 and the power supply line VDD may be provided in the same layer and with the same material, and the screening pattern 31 and the power supply line VDD may be provided in different layers.

Illustratively, the shielding pattern 30 and the power supply line VDD may also be provided in different layers.

The above-mentioned arrangement can reduce the difficulty in design the layout of the shielding pattern 30 and the power supply line VDD, while ensuring that the shielding pattern 30 does not short-circuit with a peripheral conductive structure.

As shown in FIGS. 23 to 28 and 31, in some embodiments, the active layer 21 of the compensation transistor T2 further includes a first channel sub-portion 210, a second channel sub-portion 211, and a channel connection portion, and the channel connection portion is coupled to the first channel sub-portion 210 and the second channel sub-portion 211.

An orthographic projection of the screening pattern 31 onto the base 50 at least partially overlaps with an orthographic projection of a corresponding channel connection portion onto the base 50.

Illustratively, the channel connection portion and is formed as one-piece structure with the first channel sub-portion 210 and the second channel sub-portion 211. The channel connection portion has a better conductivity than the first channel sub-portion 210 and the second channel sub-portion 211.

Illustratively, the orthographic projection of the screening pattern 31 onto the base 50 covers the orthographic projection of the corresponding channel connection portion onto the base 50.

In the display substrate provided in the above-mentioned embodiments, by arranging the orthographic projection of the screening pattern 31 onto the base 50 to be at least partially overlapped with the orthographic projection of the corresponding channel connection portion onto the base 50, the screening pattern 31 has a screening effect on the channel connection portion and the stability of the channel connection portion can be ensured, which can further improve the stability of the compensation transistor T2 and the stability of the voltage at the N1 node.

As shown in FIGS. 23 to 28 and 31, in some embodiments, the orthographic projection of the shielding pattern 30 onto the base 50 is arranged to be at least partially overlapped with the orthographic projection of the corresponding channel connection portion on the base 50.

Illustratively, the orthographic projection of the shielding pattern 30 onto the base 50 covers the orthographic projection of the corresponding channel connection portion on the base 50.

The above-mentioned arrangement enables the shielding pattern 30 to have a shielding effect on the channel connection portion, so as to ensure the stability of the channel connection portion, which can improve the stability of the compensation transistor T2 and the stability of the voltage at the N1 node.

As shown in FIG. 26, in some embodiments, there is an overlapping region between the orthographic projection of the screening pattern 31 onto the base 50 and an orthographic projection of a corresponding shielding pattern 30 onto the base 50, the screening pattern 31 is coupled to the shielding pattern 30 by a via hole Via0 in the overlapping region, and at least a portion of the orthographic projection of the channel connection portion onto the base 50 is located in the overlapping region.

Illustratively, there is an overlapping region between the orthographic projection of the screening pattern 31 onto the base 50 and an orthographic projection of a corresponding power supply line VDD onto the base 50, and the screening pattern 31 is coupled to the power supply line VDD by a via hole at such overlapping region, to enable the screening pattern 31 to have a constant potential.

In the display substrate provided in the above-mentioned embodiments, by arranging at least a portion of the orthographic projection of the channel connection portion onto the base 50 to be located in the above-mentioned overlapping region, the layout space occupied by the screening pattern 31 and the shielding pattern 30 can be advantageously reduced, and the difficulty in design the layout of the screening pattern 31 and the shielding pattern 30 can be reduced.

As shown in FIGS. 23 to 28 and 31, in some embodiments, the screening pattern 31 is arranged to be located at a second conductor layer in the display substrate, and the shielding pattern 30 is arranged to be located at a first source-drain metal layer in the display substrate. That is, the screening pattern 31 is fabricated by using the second conductor layer in the display substrate, and the shielding pattern 30 is fabricated by using the first source-drain metal layer in the display substrate.

Illustratively, both the power supply line VDD and the shielding pattern 30 are fabricated by using the first source-drain metal layer in the display substrate.

The above-mentioned arrangement enables a jumper wire connection between the shielding pattern 30 and the power supply line VDD via the screening pattern 31, thereby ensuring the connection performance while reducing layout difficulty.

As shown in FIGS. 18 to 22, in some embodiments, the display substrate is arranged to further include multiple first initialization signal lines Vinit1, and the shielding pattern 30 is coupled to the first initialization signal line Vinit1.

Illustratively, the shielding pattern 30 includes at least a portion extending in the first direction.

With the above-mentioned arrangement, the shielding pattern 30 not only can shield the channel portion of the compensation transistor T2 and improve the stability of the N1 node, but also can have the same constant potential as the first initialization signal to avoid a fluctuation in the characteristics of the compensation transistor T2 caused by a coupling due to fluctuations of other signals.

As shown in FIGS. 18 to 22, in some embodiments, the sub-pixel driving circuit further includes a first conductive connection portion 11 and a first reset transistor T1. The first conductive connection portion 11 is coupled to the first initialization signal line Vinit1, the shielding pattern 30 is coupled to a first electrode of the first reset transistor T1; a second electrode of the first reset transistor T1 is coupled to the gate electrode of the driving transistor T3.

Illustratively, the first conductive connection portion 11 includes at least a portion extending in the second direction.

Illustratively, there is an overlapping region between the orthographic projection of the first conductive connection portion 11 onto the base 50 and an orthographic projection of the first initialization signal line Vinit1 onto the base 50, and the first conductive connection portion 11 is coupled to the first initialization signal line Vinit1 by a via hole in the overlapping region. There is an overlapping region between the orthographic projection of the first conductive connection portion 11 onto the base 50 and an orthographic projection of the second electrode of the first reset transistor T1 onto the base 50, and the first conductive connection portion 11 is coupled to the second electrode of the first reset transistor T1 by a via hole in the overlapping region.

The above-mentioned arrangement can reduce the layout space occupied by the first conductive connection portion 11, the first initialization signal line Vinit1, and the first reset transistor T1 to a large extent, and thus reducing the layout difficulty of the display substrate.

As shown in FIGS. 18 to 22, in some embodiments, the shielding pattern 30 and the first conductive connection portion 11 coupled to the shielding pattern 30 are formed as one-piece structure, and the first conductive connection portion 11 is located in the first source-drain metal layer in the display substrate.

With the above-mentioned arrangement, the shielding pattern 30 and the first conductive connection portion 11 can be formed in the same patterning process, which is beneficial to simplify the manufacturing process of the display substrate.

As shown in FIGS. 18 to 22 and 30, in some embodiments, the shielding pattern 30 and the first conductive connection portion 11 are located in the first source-drain metal layer in the display substrate, i.e., the shielding pattern 30 and the first conductive connection portion 11 are fabricated by using the first source-drain metal layer in the display substrate.

Illustratively, the shielding pattern 30 is fabricated by using the first source-drain metal layer in the display substrate, and the power supply line VDD and the data line DA are both fabricated by using the second source-drain metal layer.

In a case that the shielding pattern 30 is fabricated by using the first source-drain metal layer or the second source-drain metal layer, the above-mentioned effects 1 to 5 can be achieved.

As shown in FIGS. 18 to 22 and 30, in some embodiments, the active layer 21 of the compensation transistor T2 is arranged to further include a first channel sub-portion 210, a second channel sub-portion 211, and a channel connection portion. The channel connection portion is coupled to the first channel sub-portion 210 and the second channel sub-portion 211.

An orthographic projection of the first initialization signal line Vinit1 onto the base 50 at least partially overlaps with an orthographic projection of a corresponding channel connection portion onto the base 50.

Illustratively, the orthographic projection of the first initialization signal line Vinit1 onto the base 50 covers the orthographic projection of the corresponding channel connection portion onto the base 50.

The above-mentioned arrangement enables the first initialization signal line Vinit1 to have a shielding effect on the channel connection portion, the stability of the channel connection portion can be ensured, which can in turn improve the stability of the compensation transistor T2 and the stability of the voltage at the N1 node.

As shown in FIGS. 2 to 5 and 7, in some embodiments, the first initialization signal line Vinit1 is arranged to include a main body portion Vinit10 and a protruding portion Vinit11. The main body portion Vinit10 extends in the second direction and the protruding portion Vinit11 protrudes from the main body portion Vinit10 in the first direction.

An orthographic projection of the protruding portion Vinit11 onto the base 50 at least partially overlaps with an orthographic projection of a corresponding channel connection portion onto the base 50.

Illustratively, the main body portion Vinit10 and the protruding portion Vinit11 are formed as one-piece structure.

The above-mentioned arrangement enables the first initialization signal line Vinit1 to have a shielding effect on the channel connection portion, the stability of the channel connection portion can be ensured, which can in turn improve the stability of the compensation transistor T2 and the stability of the voltage at the N1 node. In addition, it is beneficial to reduce the layout difficulty of the display substrate.

As shown in FIGS. 1 to 17, in some embodiments, the display substrate includes multiple power supply lines VDD, multiple light-emitting control lines EM, multiple gate lines GA, multiple data lines DA, multiple reset lines Rst1, multiple first initialization signal lines Vinit1, and multiple second initialization signal lines Vinit2.

The sub-pixel driving circuit further includes: a storage capacitor, a first reset transistor T1, a data writing transistor T4, a power supply control transistor T5, a light-emitting control transistor T6, and a second reset transistor T7;
- a gate electrode of the first reset transistor T1 is coupled to a corresponding reset line Rst1, a first electrode of the first reset transistor T1 is coupled to a corresponding first initialization signal line Vinit1, and a second electrode of the first reset transistor T1 is coupled to a gate electrode of the driving transistor T3;
- a gate electrode of the data writing transistor T4 is coupled to a corresponding gate line GA, a first electrode of the data writing transistor T4 is coupled to a corresponding data line DA, and a second electrode of the data writing transistor T4 is coupled to a first electrode of the driving transistor T3;
- a gate electrode of the power supply control transistor T5 is coupled to a corresponding light-emitting control line EM, a first electrode of the power supply control transistor T5 is coupled to a corresponding power supply line VDD, and a second electrode of the power supply control transistor T5 is coupled to the first electrode of the driving transistor T3;
- a gate electrode of the light-emitting control transistor T6 is coupled to a corresponding light-emitting control line EM, a first electrode of the light-emitting control transistor T6 is coupled to a second electrode of the driving transistor T3, and a second electrode of the light-emitting control transistor T6 is coupled to a corresponding light-emitting element;
- a gate electrode of the second reset transistor T7 is coupled to a corresponding reset line Rst1/Rst2, a first electrode of the second reset transistor T7 is coupled to a corresponding second initialization signal line Vinit2, and a second electrode of the second reset transistor T7 is coupled to a corresponding light-emitting element; and
- a first plate Cst1 of the storage capacitor Cst is coupled to the gate electrode T3-g of the driving transistor T3, and a second plate Cst2 of the storage capacitor Cst is coupled to a corresponding power supply line VDD.

Illustratively, the multiple light-emitting control lines EM are in one-to-one correspondence to the multiple rows of sub-pixel driving circuits, and the light-emitting control line EM is coupled to each sub-pixel driving circuit in a corresponding row of sub-pixel driving circuits. The light-emitting control line EM includes at least a portion extending in the second direction.

Illustratively, the multiple gate lines GA are in one-to-one correspondence to multiple rows of sub-pixel driving circuits, and the gate line GA is coupled to each sub-pixel driving circuit in a corresponding row of sub-pixel driving circuits. The gate line GA includes at least a portion extending in the second direction.

Illustratively, the multiple data lines DA are in one-to-one correspondence to multiple columns of sub-pixel driving circuits, and the data line DA is coupled to each sub-pixel driving circuit in a corresponding column of sub-pixel driving circuits. The data line DA includes at least a portion extending in the first direction.

Illustratively, the multiple reset lines Rst1 are in one-to-one correspondence to multiple rows of sub-pixel driving circuits, and the reset line Rst1 is coupled to each sub-pixel driving circuit in a corresponding row of sub-pixel driving circuits. The gate electrode of the second reset transistor T7 in the sub-pixel driving circuit is coupled to a reset line Rst1 which is coupled to the next adjacent sub-pixel driving circuit in the first direction. The reset line Rst1 includes at least a portion extending in the second direction.

Illustratively, the multiple first initialization signal lines Vinit1 are in one-to-one correspondence to the multiple rows of sub-pixel driving circuits, and the first initialization signal line Vinit1 is coupled to each sub-pixel driving circuit in a corresponding row of sub-pixel driving circuits. The multiple first initialization signal lines Vinit1 each includes at least a portion extending in the second direction.

Illustratively, the multiple second initialization signal lines Vinit2 are in one-to-one correspondence to the multiple rows of sub-pixel driving circuits, and the second initialization signal line Vinit2 is coupled to each sub-pixel driving circuit in a corresponding row of sub-pixel driving circuits. The multiple second initialization signal lines Vinit2 each include at least a portion extending in the second direction.

To be specific, the sub-pixel driving circuit includes a first reset transistor T1, a compensation transistor T2, a driving transistor T3, a data writing transistor T4, a power supply control transistor T5, a light-emitting control transistor T6, a second reset transistor T7, and a storage capacitor Cst.

When the sub-pixel driving circuit of the above-mentioned structure is in operation, each operation cycle includes a reset period, a writing compensation period, and a light-emitting period.

During the reset period, the reset signal input by the reset line Rst is at an active level, the first reset transistor T1 is turned on, and the first initialization signal transmitted by the first initialization signal film layer Vinit1 is input to the gate electrode T3-g of the driving transistor T3, so that the gate-source voltage Vgs stored on the driving transistor T3 in the previous frame are cleared, thereby resetting the gate electrode T3-g of the driving transistor T3.

During the writing compensation period, the reset signal is at a non-active level, the first reset transistor T1 is turned off, the gate electrode scanning signal input by the gate line GA is at an active level, the compensation transistor T2 and the data writing transistor T4 are controlled to be turned on. The data line DA writes a data signal, which is transmitted to the first electrode of the driving transistor T3 via the data writing transistor T4. At the same time, the compensation transistor T2 and the data writing transistor T4 are turned on, so that the driving transistor T3 is formed as a diode structure, thus a threshold voltage compensation of the driving transistor T3 is realized by the cooperation of the compensation transistor T2, the driving transistor T3, and the data writing transistor T4. When the compensation time is long enough, the potential of the gate electrode T3-g of the driving transistor T3 may be controlled to finally reach Vdata+Vth, where Vdata represents a voltage value of the data signal and Vth represents a threshold voltage of the driving transistor T3. The reset signal input by the next adjacent reset line Rst2 along the first direction is at an active level, and the second reset transistor T7 is controlled to be turned on. The second initialization signal input by the second initialization signal line Vinit2 is input to the anode of the light-emitting element EL to initialize the anode. The light-emitting element EL is controlled not to emit light. Illustratively, the gate line GA corresponding to the current row of sub-pixel driving circuits and the reset line Rst2 corresponding to the next adjacent row of sub-pixel driving circuits along the first direction are inputted with the same signal.

During the light-emitting period, a light-emitting control signal written by the light-emitting control line EM is at an active level, and the power supply control transistor T5 and the light-emitting control transistor T6 are controlled to be turned on, so that a power supply signal transmitted by the power supply line VDD is input to the first electrode of the driving transistor T3. At the same time, since the gate electrode T3-g of the driving transistor T3 is maintained at Vdata+Vth, the driving transistor T3 is turned on; a gate-source voltage corresponding to the driving transistor T3 is Vdata+Vth−VDD, where VDD is a voltage value corresponding to the power supply signal; the leakage current generated based on the gate-source voltage flows to the anode of the corresponding light-emitting element EL, and drives the corresponding light-emitting element EL to emit light. The cathode of the light-emitting element EL is connected to a negative power supply signal VSS.

The display substrate according to the above-mentioned embodiments includes: a semiconductor layer, a first gate electrode insulating layer GI1, a first conductor layer, a second gate electrode insulating layer GI2, a second conductor layer, an interlayer insulating layer ILD, a first source-drain metal layer, a first planarization layer PLN1, a second source-drain metal layer, a second planarization layer PLN2, an ITO1 layer, a third planarization layer PLN3, an ITO2 layer, a fourth planarization layer PLN4, an ITO3 layer, a fifth planarization layer, an anode layer 40, a pixel definition layer, a light-emitting functional layer, a cathode layer, and an encapsulation layer which are sequentially stacked on the base 50 along a direction away from the base. A passivation layer may also be included in the display substrate.

Figure 2:
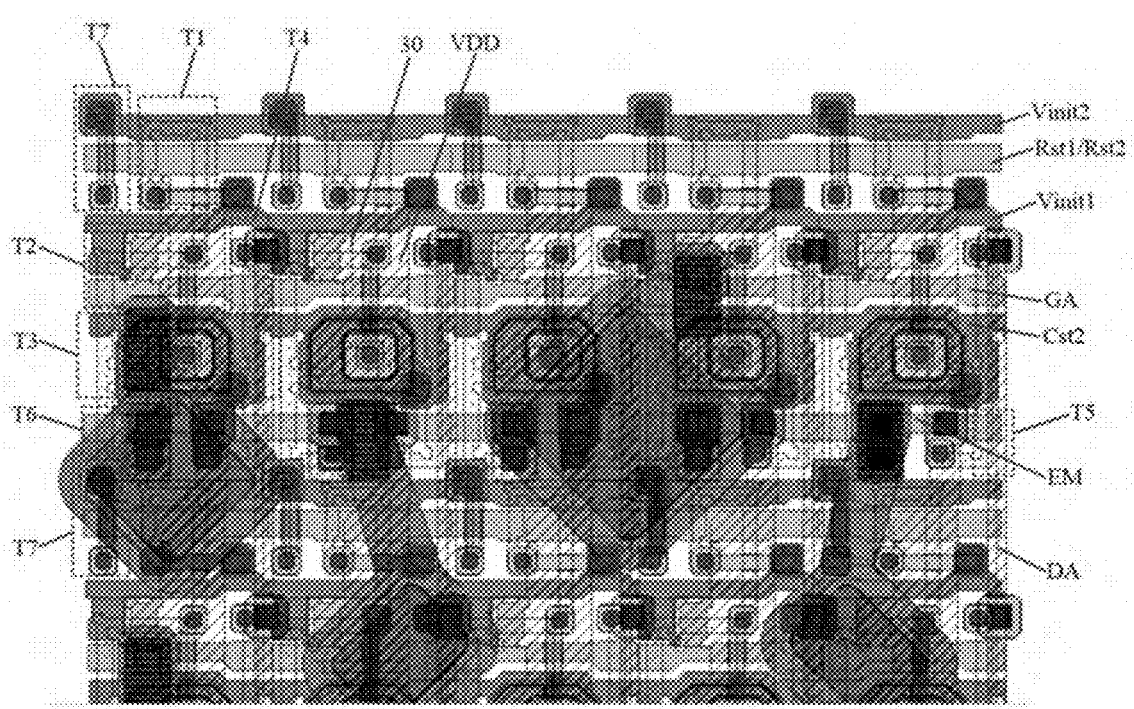
FIG. 2 is a schematic diagram showing a first layout of a sub-pixel provided in an embodiment of the present disclosure.
Figure 3:
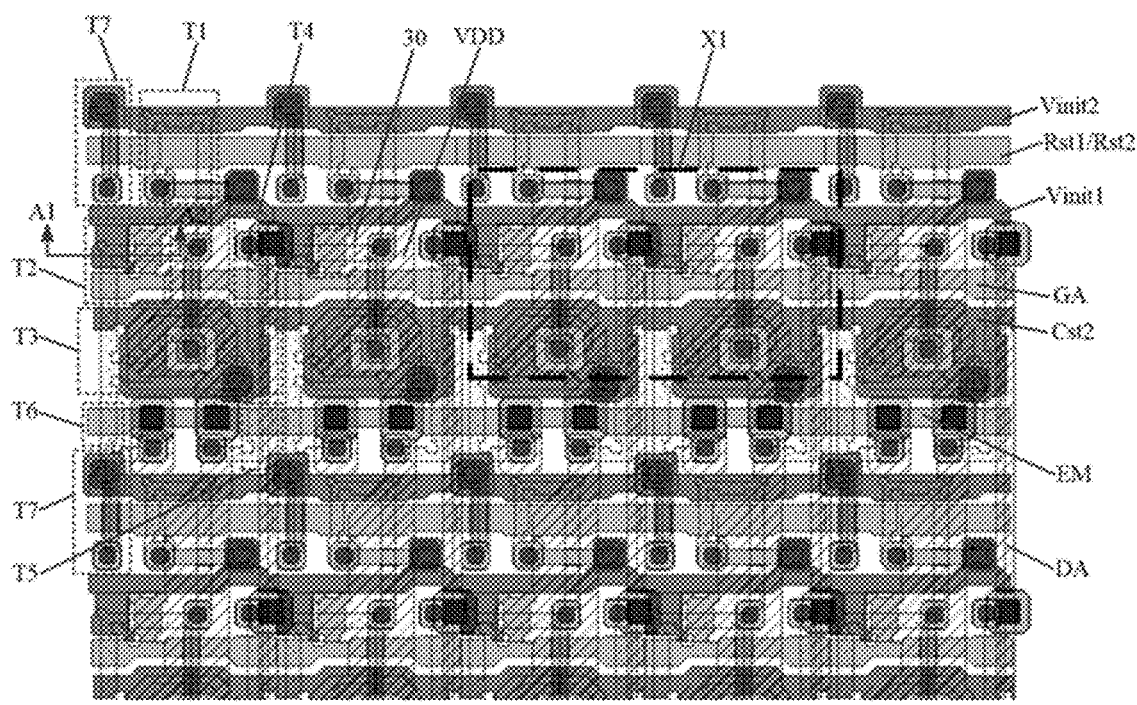
FIG. 3 is a schematic diagram showing the layout in FIG. 2 with an anode layer being removed.
Figure 4:
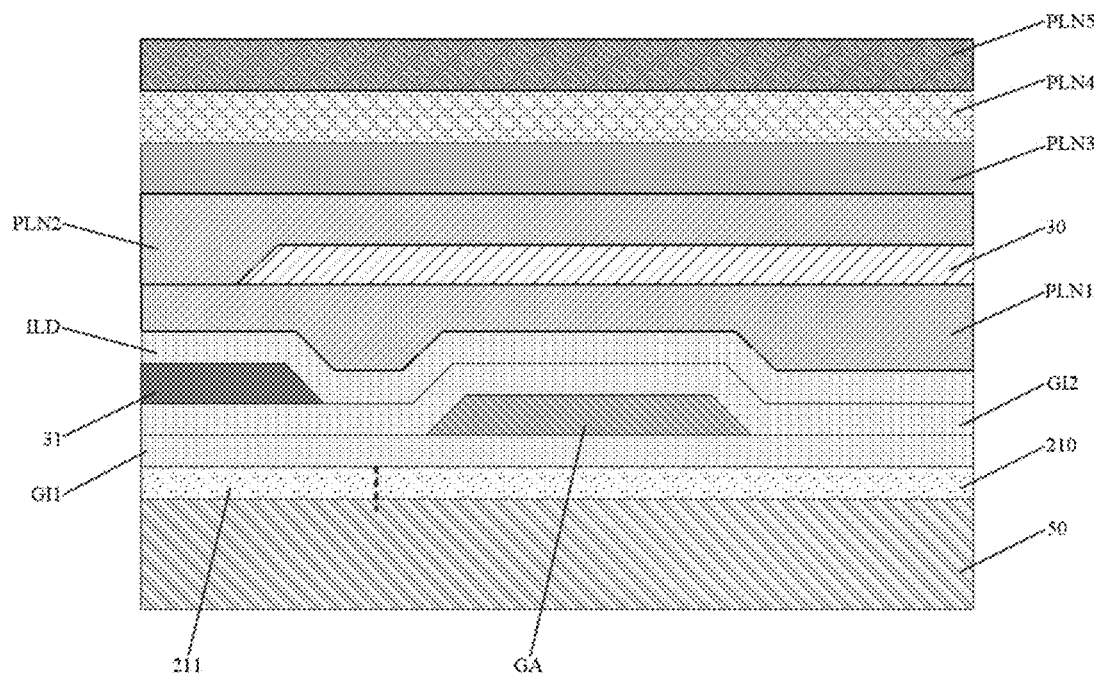
FIG. 4 is a schematic diagram showing a cross-section taken along a direction A1A2 in FIG. 3.
Figure 13:
FIG. 13 is a schematic diagram showing a layout of via holes formed in a second planarization layer in FIG. 2.
Figure 14:
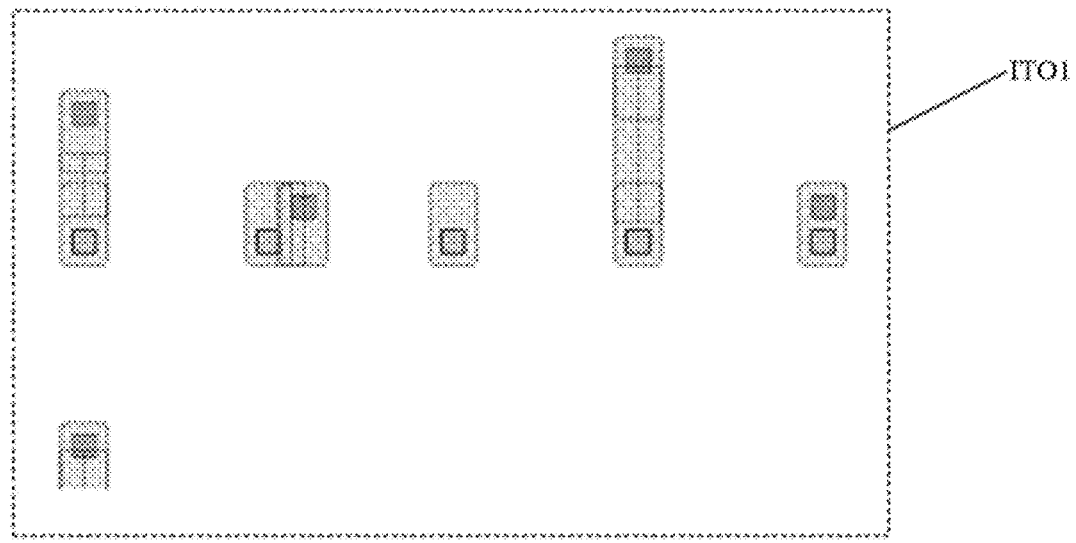
FIG. 14 is a schematic diagram showing a layout of a ITO1 layer, via holes for the second planarization layer, and via holes for a third planarization layer in FIG. 2.
Figure 15:
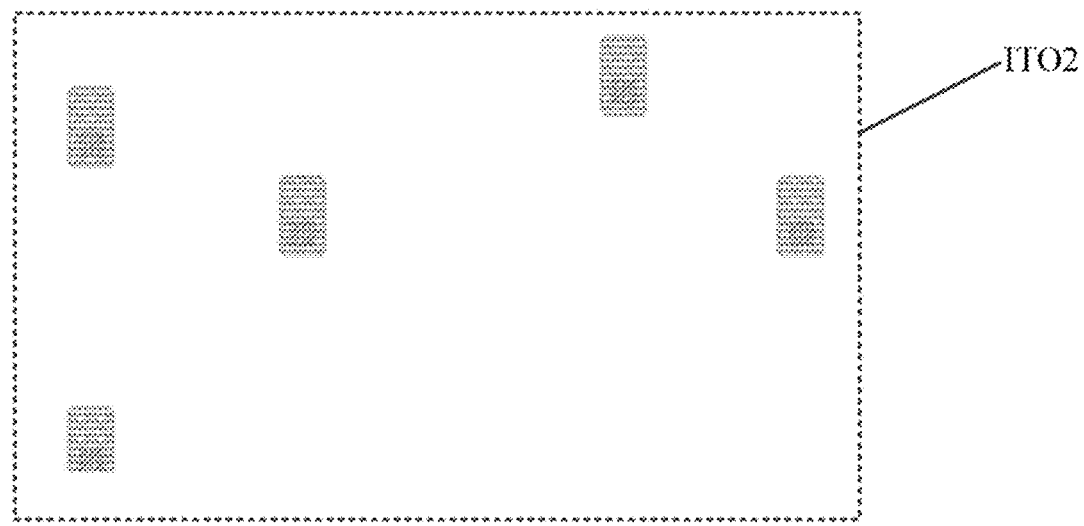
FIG. 15 is a schematic diagram showing a layout of a ITO2 layer and via holes for a fourth planarization layer in FIG. 2.
Figure 16:
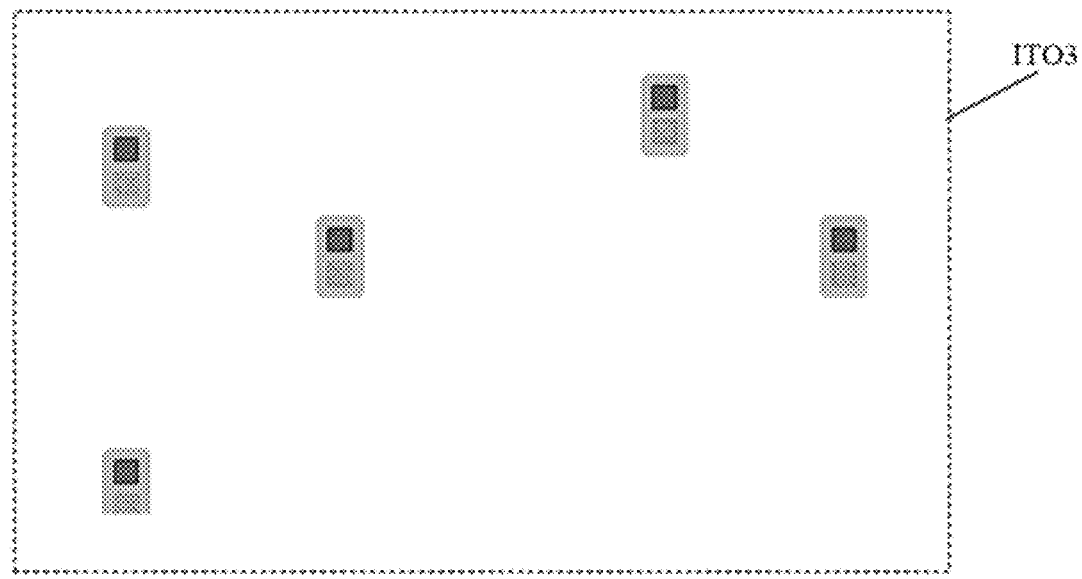
FIG. 16 is a schematic diagram showing a layout of a ITO3, via holes for the fourth planarization layer, and via holes for a fifth planarization layer in FIG. 2.
Figure 17:
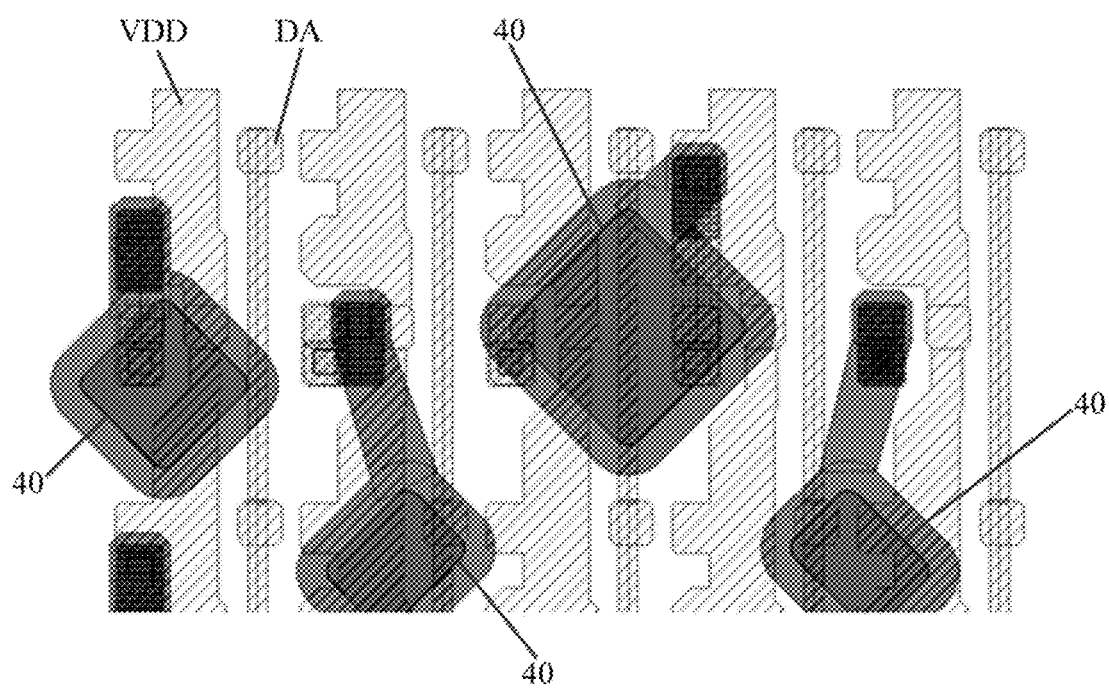
FIG. 17 is a schematic diagram showing a layout of the second source-drain metal layer to an anode layer in FIG. 2.
Figure 18:
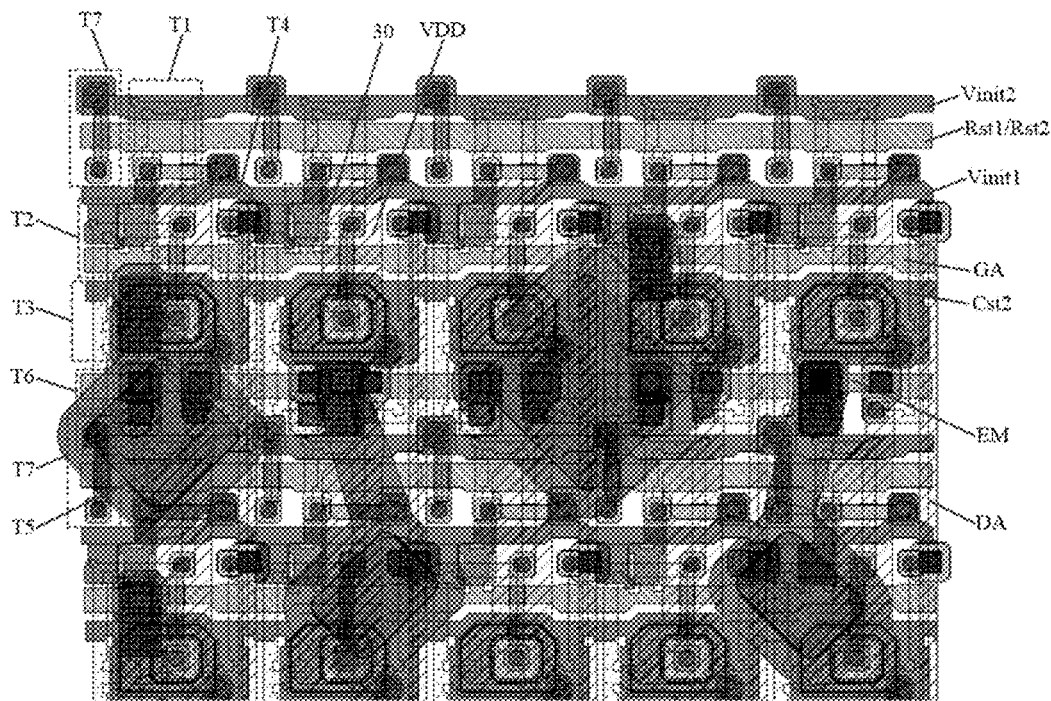
FIG. 18 is a second schematic diagram showing a second layout of a sub-pixel provided in an embodiment of the present disclosure.

It should be noted that FIG. 13 is a schematic diagram showing a layout of via holes formed in the second planarization layer in FIG. 2; FIG. 14 is a schematic diagram showing a layout of the ITO1 layer, via holes for the second planarization layer, and via holes for the third planarization layer in FIG. 2; FIG. 15 is a schematic diagram showing a layout of the ITO2 layer and via holes for the fourth planarization layer in FIG. 2; and FIG. 16 is a schematic diagram showing a layout of the ITO3, via holes for the fourth planarization layer, and via holes for the fifth planarization layer in FIG. 2.

As shown in FIGS. 14 to 17, the pattern formed in the ITO1 layer in FIG. 14 can be electrically connected to a conductive structure in the second source-drain metal layer through the via holes in FIG. 13. The pattern formed in the ITO1 layer in FIG. 14 can be electrically connected to a corresponding pattern formed in the ITO2 layer in FIG. 15 through the via holes for the third planarization layer. The pattern formed in the ITO2 layer in FIG. 15 can be electrically connected to a corresponding pattern formed in the ITO3 layer in FIG. 16 through the via holes for fourth planarization layer. The pattern formed in the ITO3 layer in FIG. 16 can be coupled to the anode layer 40 illustrated in FIG. 17.

Figure 5:
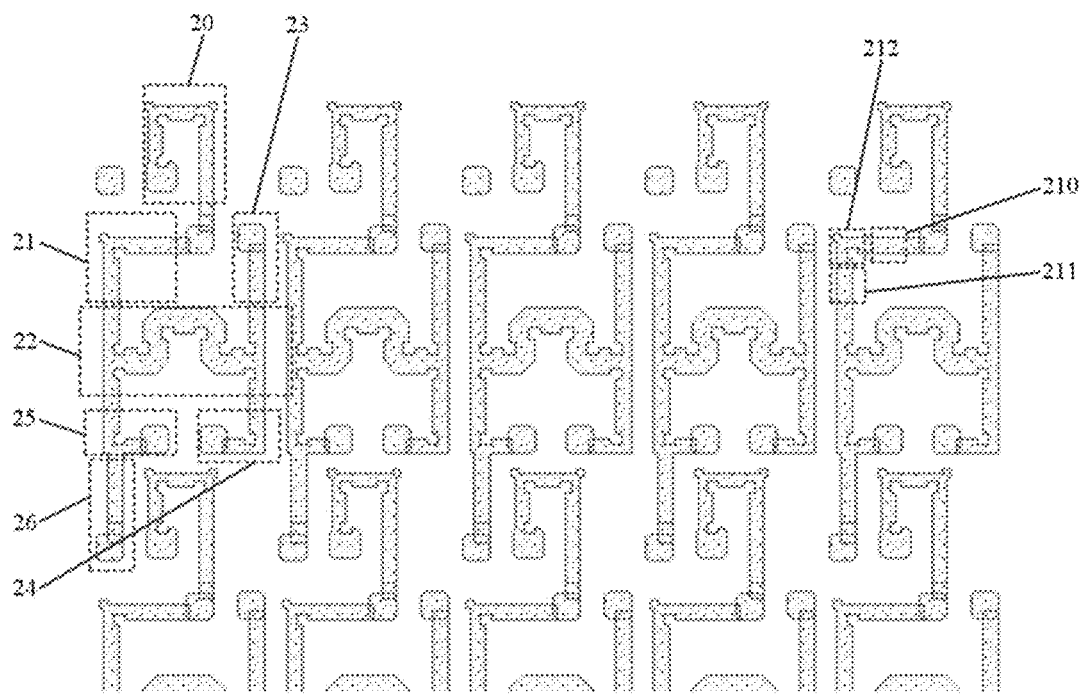
FIG. 5 is a schematic diagram showing a layout of a semiconductor layer in FIG. 2.

As shown in FIG. 5, the semiconductor layer is used to form: a first reset active layer 20 included in the first reset transistor T1, an active layer 21 included in the compensation transistor T2, an active layer 22 included in the driving transistor T3, a data writing active layer 23 included in the data writing transistor T4, a power supply control active layer 24 included in the power supply control transistor T5, a light-emitting control active layer 25 included in the light-emitting control transistor T6, a second reset active layer 26 included in the second reset transistor T7, and some conductive structures.

Figure 6:
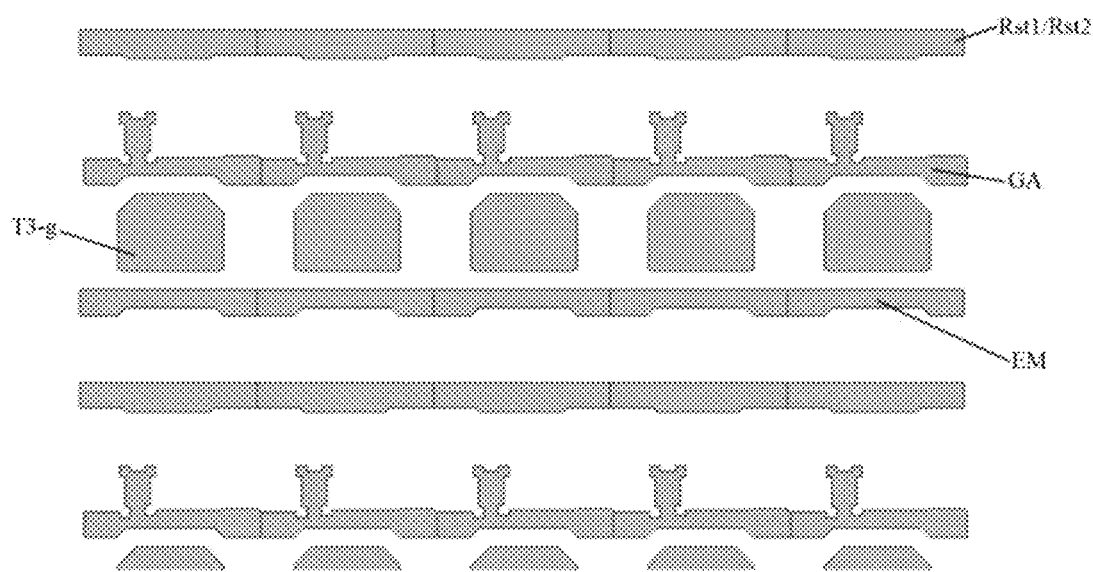
FIG. 6 is a schematic diagram showing a layout of a first conductor layer in FIG. 2.

As shown in FIG. 6, the first conductor layer is used to form: the reset line Rst, the gate line GA and the light-emitting control line EM, and gate electrodes of various transistors.

Figure 7:
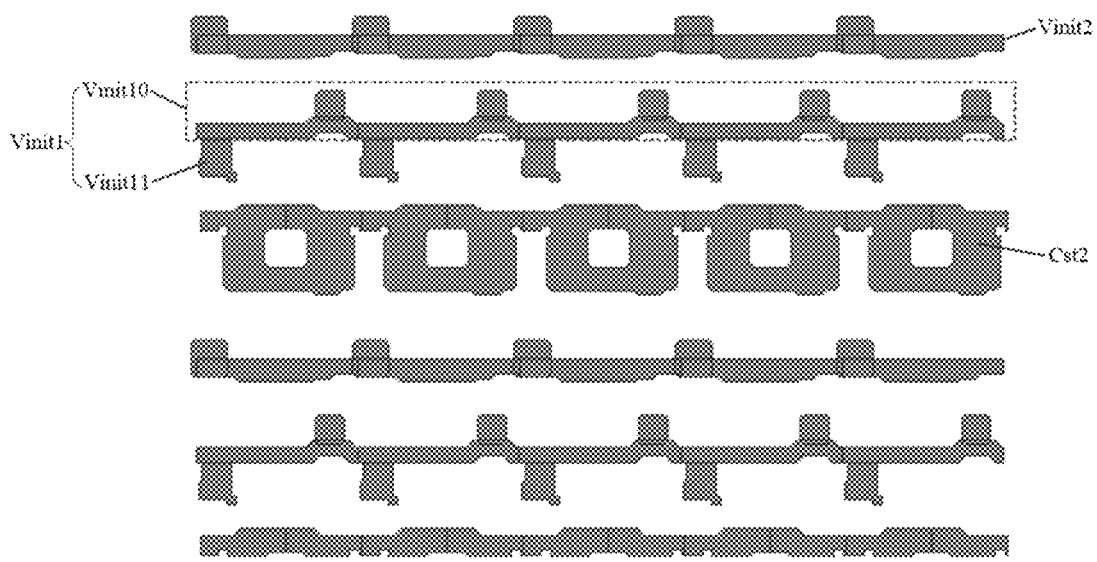
FIG. 7 is a schematic diagram showing a layout of a second conductor layer in FIG. 2.
Figure 8:
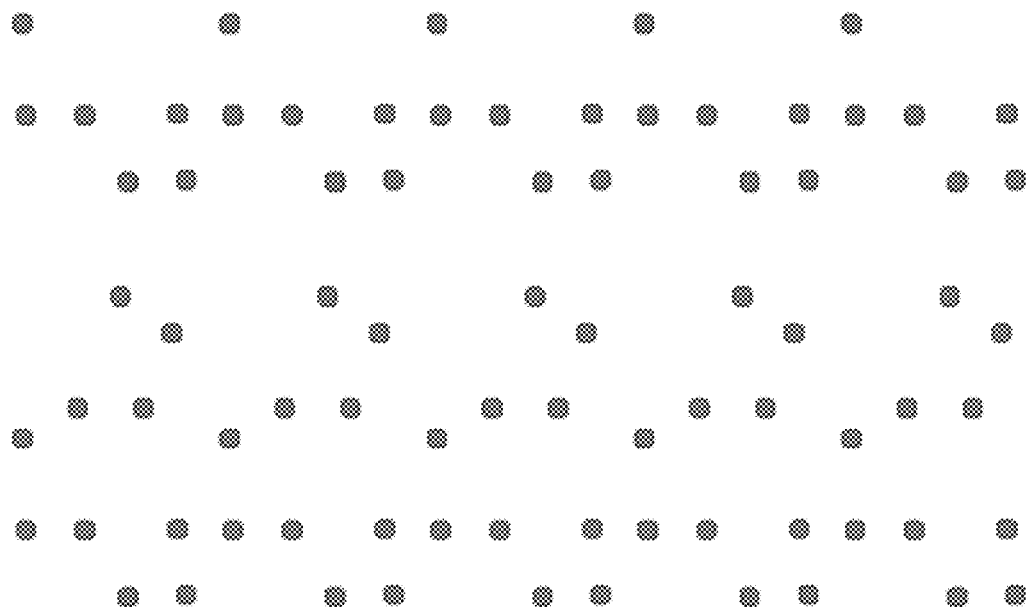
FIG. 8 is a schematic diagram showing a layout of via holes formed in an interlayer insulating layer in FIG. 2.
Figure 27:
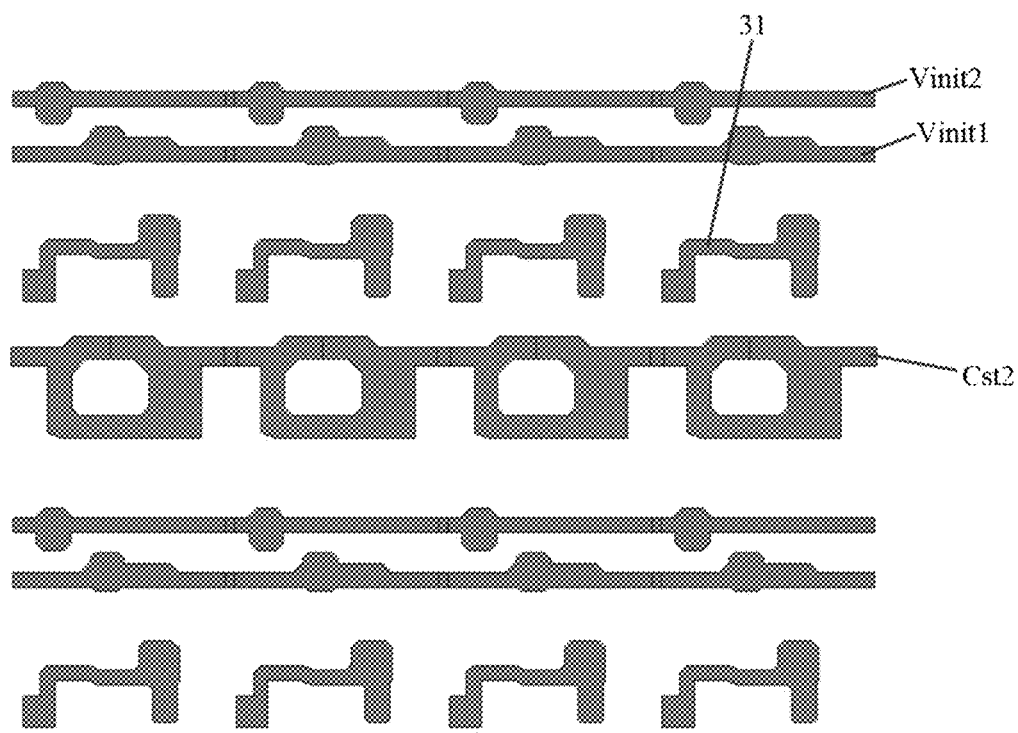
FIG. 27 is a schematic diagram showing a layout of a second conductor layer in FIG. 23.

As shown in FIGS. 7 and 27, the second conductor layer is used to form: the first initialization signal line Vinit1, the second initialization signal line Vinit2, the screening pattern 31, and the second plate Cst2 of the storage capacitor Cst.

As shown in FIG. 12, the second source-drain metal layer is used to form: the shielding pattern 30, the power supply line VDD, the data line DA, and the seventh conductive connection portion 17.

Figure 9:
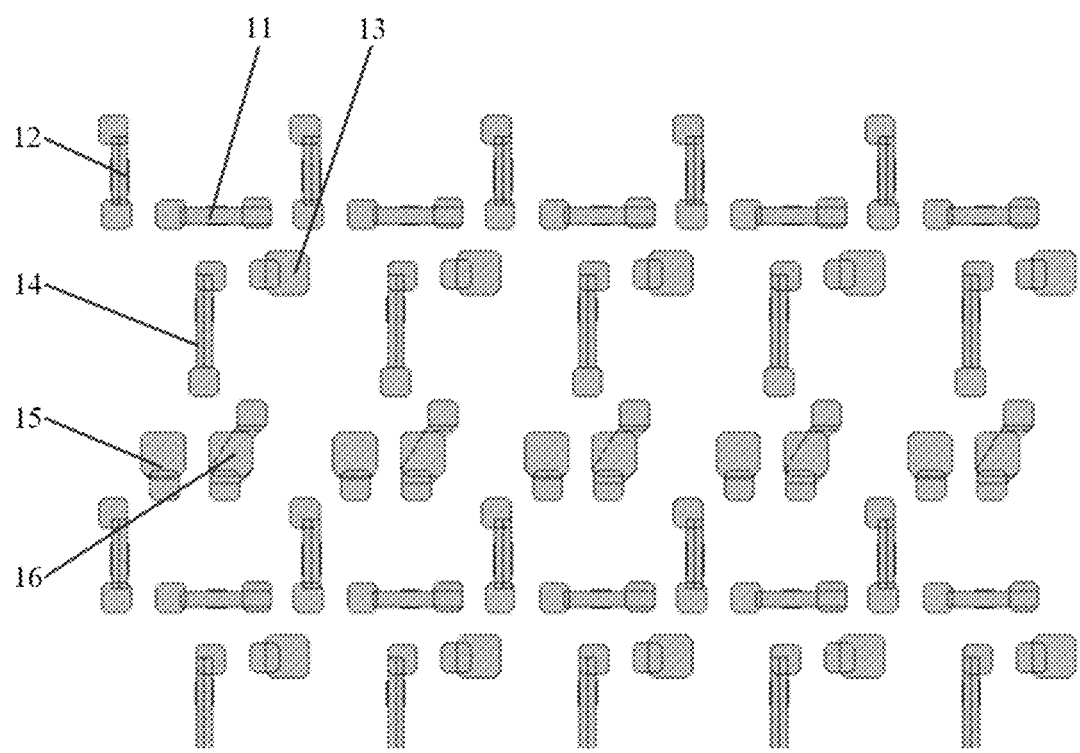
FIG. 9 is a schematic diagram showing a layout of a first source-drain metal layer in FIG. 2.
Figure 10:
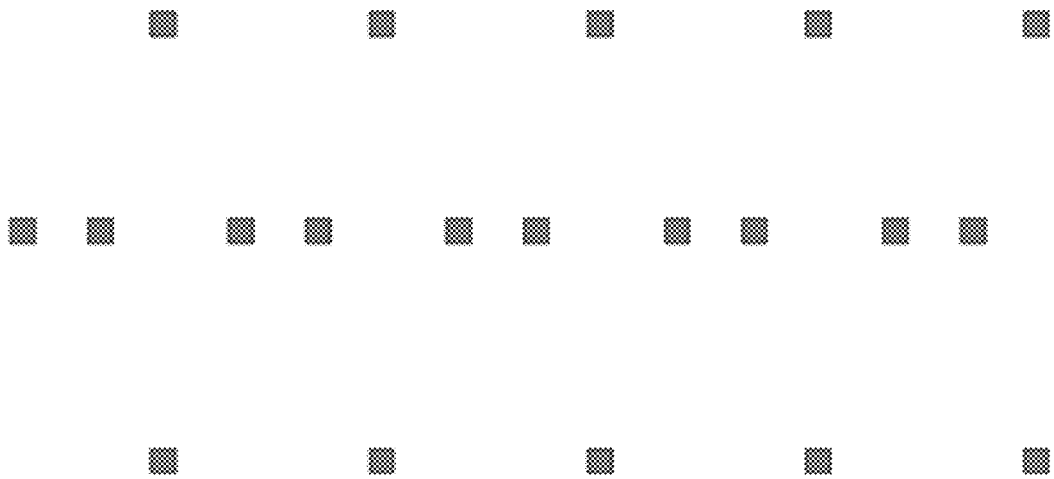
FIG. 10 is a schematic diagram showing a layout of via holes formed in a passivation layer in FIG. 2.
Figure 11:
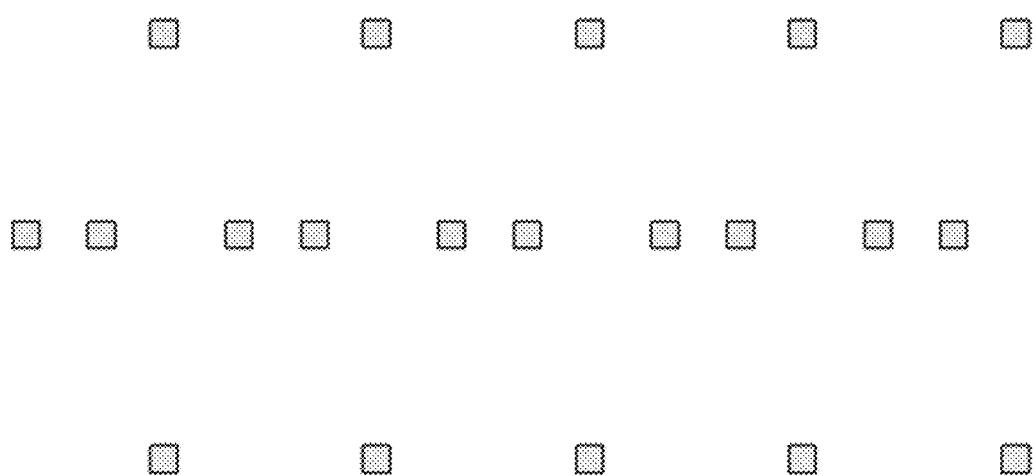
FIG. 11 is a schematic diagram showing a layout of via holes formed in a first planarization layer in FIG. 2.

As shown in FIG. 9, the first source-drain metal layer is used to form: the first conductive connection portion 11, the second conductive connection portion 12, the third conductive connection portion 13, the fourth conductive connection portion 14, the fifth conductive connection portion 15, and the sixth conductive connection portion. The first conductive connection portion 11 is used to couple the first electrode of the first reset transistor T1 to the first initialization signal line Vinit1. The second conductive connection portion 12 is used to couple the first electrode of the second reset transistor T7 to the second initialization signal line Vinit2. The third conductive connection portion 13 is used to couple the first electrode of the data writing transistor T4 to the data line DA. The fourth conductive connection portion 14 is used to couple the gate electrode T3-g of the driving transistor T3 to the second electrode of the compensation transistor T2. The fifth conductive connection portion 15 is used to couple the second electrode of the light-emitting control transistor T6 to the seventh conductive connection portion 17. The sixth conductive connection portion 16 is used to couple the first electrode of the power supply control transistor T5 to the power supply line VDD.

Figure 19:
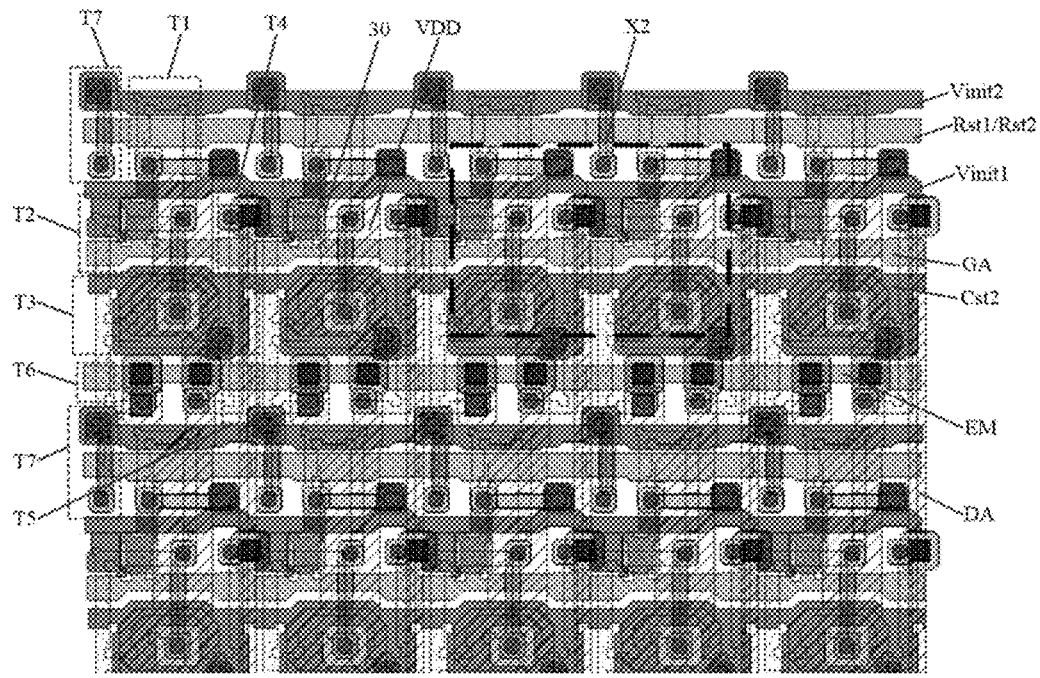
FIG. 19 is a schematic diagram showing the layout in FIG. 18 with an anode layer being removed.
Figure 20:
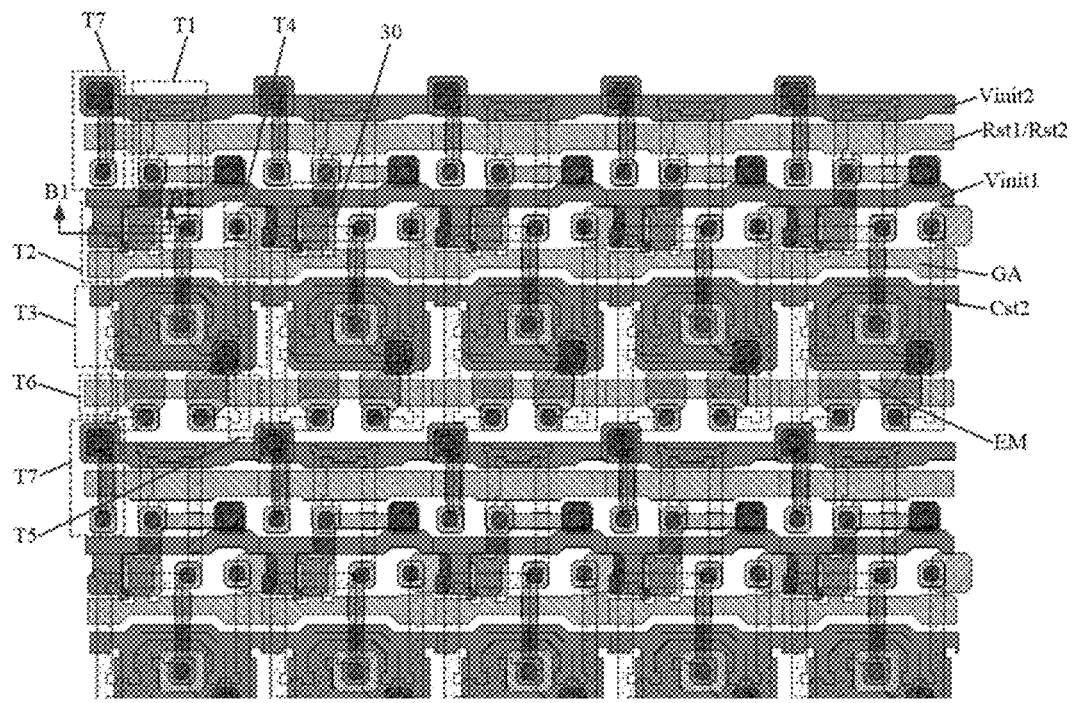
FIG. 20 is a schematic diagram showing the layout in FIG. 19 with a second source-drain metal layer being removed.
Figure 21:
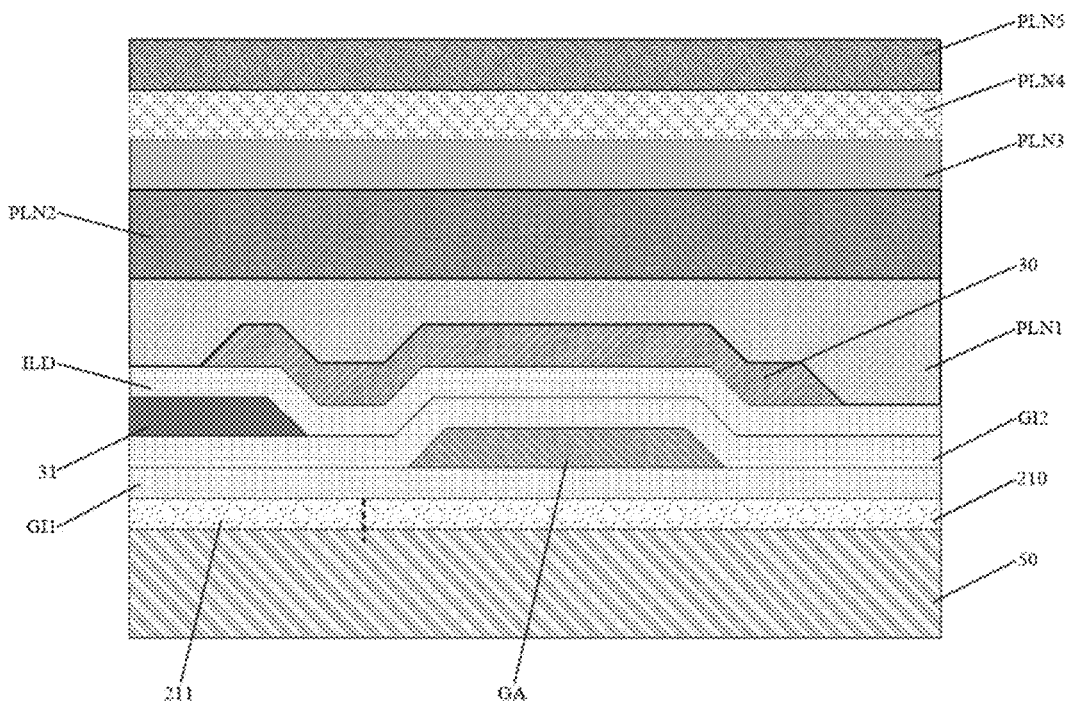
FIG. 21 is a schematic diagram showing a cross-section taken along the direction B1B2 in FIG. 20.
Figure 22:
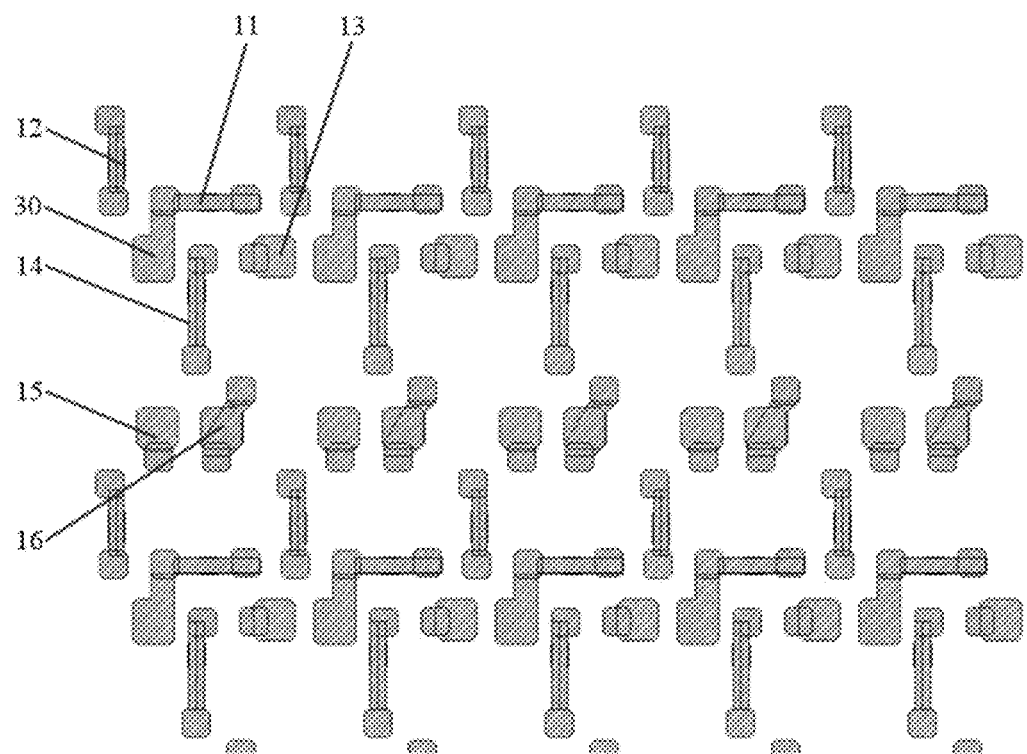
FIG. 22 is a schematic diagram showing a layout of a first source-drain metal layer of FIG. 18.
Figure 23:
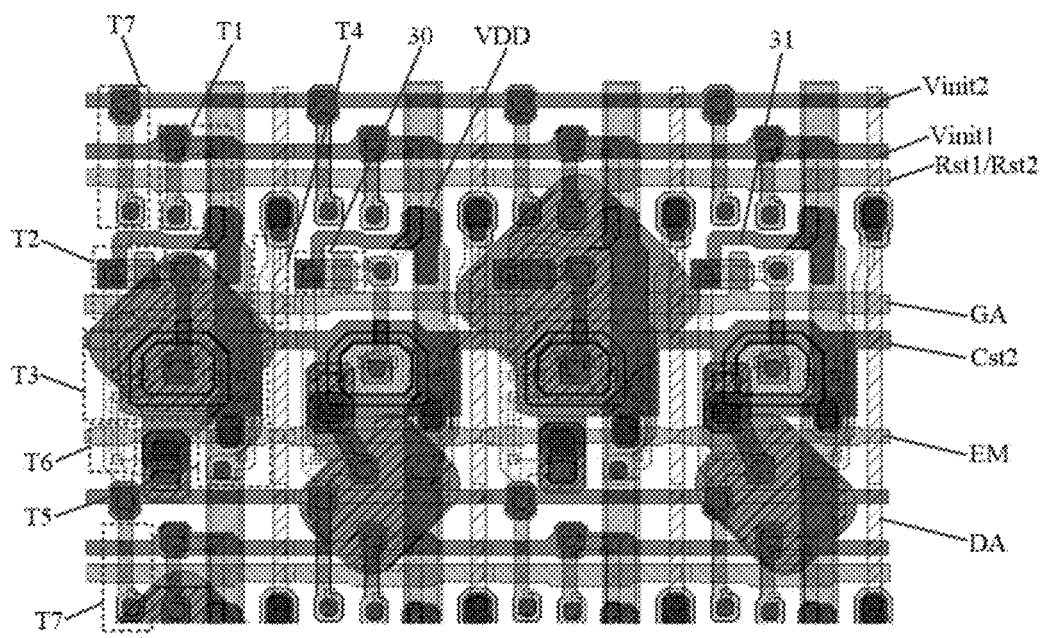
FIG. 23 is a third schematic diagram showing a third layout of a sub-pixel provided in an embodiment of the present disclosure.

As shown in FIGS. 19 and 22, the first source-drain metal layer is used to form: the shielding pattern 30, the first conductive connection portion 11, the second conductive connection portion 12, the third conductive connection portion 13, the fourth conductive connection portion 14, the fifth conductive connection portion 15, and the sixth conductive connection portion 16.

Figure 24:
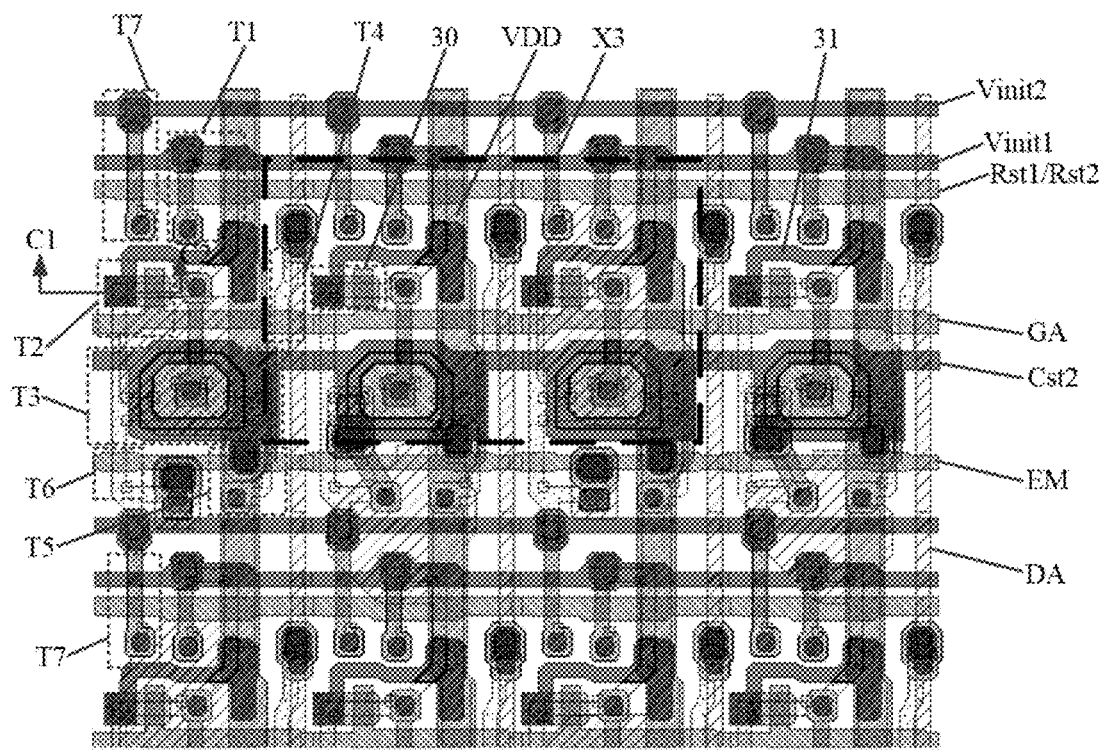
FIG. 24 is a schematic diagram showing the layout of FIG. 23 with an anode layer being removed.
Figure 25:
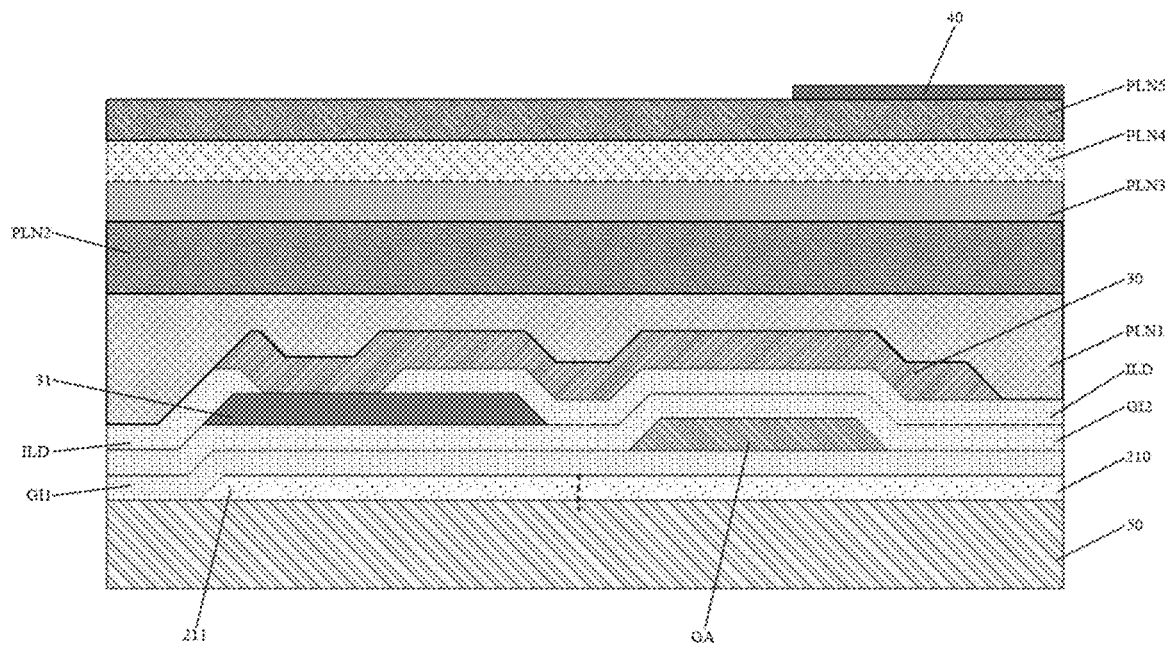
FIG. 25 is a schematic diagram showing a cross-section taken along the direction C1C2 in FIG. 24.

As shown in FIG. 28, the first source-drain metal layer is used to form: the power supply line VDD, the shielding pattern 30, the first conductive connection portion 11, the second conductive connection portion 12, the third conductive connection portion 13, the fourth conductive connection portion 14, and the fifth conductive connection portion 15. As shown in FIG. 24, the second source-drain metal layer is used to form: the data line DA and the seventh conductive connection portion 17.

Embodiments of the present disclosure also provide a display device, including the display substrate provided by the above-mentioned embodiments.

It should be noted that the display device may be: any product or component with a display function, such as a television, a display, a digital photo frame, a mobile phone, a tablet computer, where the display device further includes a flexible circuit board, a printed circuit board, and a backboard.

The display substrate provided by the above-mentioned embodiments can achieve the following technical effects.

Effect 1: the shielding pattern 30 is located between the pixel definition layer and the gate electrode of the compensation transistor T2, the shielding pattern 30 does not affect the design of the pixel isolation pillar, and can achieve a good shielding for the channel portion of the compensation transistor T2 while maximize the range of the pixel isolation pillar between sub-pixels, thereby effectively ensuring the stability of the voltage at the N1 node.

Effect 2: when the resolution of the display product is improved, using the shielding pattern 30 to shield the channel portion of the compensation transistor T2 will not influence on the anode space, thereby avoiding the case where adjacent anodes are short-circuited. In addition, the lacking shielding of the compensation transistor T2 near the boundary of the display region can be addressed. Even if there is compression in horizontal and vertical directions of the pixel when the display product adopts FDC technology, the anode space requirement can also be ensured.

Effect 3: the channel portion of the compensation transistor T2 is located between the gate electrode of the compensation transistor T2 and the base 50, and the shielding pattern 30 is located between the pixel definition layer and the gate electrode of the compensation transistor T2, so that the distance between the shielding pattern 30 and the channel portion of the compensation transistor T2 in a direction perpendicular to the base 50 is short. By arranging the orthographic projection of the shielding pattern 30 onto the base 50 to be at least partially overlapped with the orthographic projection of the channel portion of the corresponding compensation transistor T2 onto the base 50, an effective shielding can be formed for the channel portion of the compensation transistor T2, reducing the range of light diffraction affecting the channel portion of the compensation transistor T2.

Effect 4: the shielding pattern 30 is used to shield the channel portion of the compensation transistor T2 without increasing the area of the anode. For the display product with under-screen fingerprint recognition which has certain requirements for the external light transmittance, the shielding pattern 30 is used for shielding the channel portion of the compensation transistor T2, so as to ensure the transmittance of the display product, which is beneficial to the realization of the fingerprint recognition function.

Effect 5: by shielding the channel portion of the compensation transistor T2 with the shielding pattern 30, the photo-induced leakage current of the compensation transistor T2 due to the channel portion being irradiated by the light can be reduced or eliminated, and thus the influence of the compensation transistor T2 on the stability of the voltage at the N1 node due to the leakage current can be e reduced or eliminated.

When including the above-mentioned display substrate, the display device provided by the embodiments of the present disclosure also has the above-mentioned advantageous effects, which will not be described in detail herein.

It should be noted that the signal line extending in the X direction means that: the signal line includes a main portion and a secondary portion connected to the main portion; the main portion is a line, a line segment, or a bar-shaped body; the main portion extends in the X direction, and the length of the main portion extending in the X direction is greater than the length of the secondary portion extending in other directions.

It should be noted that the "same layer" of the embodiments of the present disclosure may refer to film layers on the same structural layer. Alternatively, for example, the film layers in the same layer may be such a layer structure which is formed by: using the same film layer forming process for forming a film layer having a specific pattern, and then patterning the film layer by one patterning process using the same mask. Depending on the particular pattern, a single patterning process may include multiple exposures, developments, or etching processes, and the particular pattern in the resulting layer structure may or may not be continuous. The particular pattern may also be at different heights or have different thicknesses.

In the various method embodiments of the present disclosure, the serial number of each step cannot be used to define the order of each step, and for those of ordinary skills in the art, without involving any inventive effort, changes in the order of each step are also within the scope of the present disclosure.

It should be noted that the various embodiments described herein are described in a progressive manner, the same or similar portions throughout the various embodiments can be reference to each other, with each embodiment focusing on the difference compared with the other embodiments. In particular, the method embodiments are described in a simple manner because they are substantially similar to the product embodiments, relevant portions can be refer to the description of the product embodiments.

Unless defined otherwise, technical or scientific terms used in the present disclosure shall have the ordinary meaning as understood by those of ordinary skills in the art to which the present disclosure belongs. The use of "first", "second", and the like in the present disclosure does not denote any order, quantity, or importance, but rather is used to distinguish one element from another. The word "include" or "comprise", and the like, means that the presence of an element or item preceding the word covers the presence of the element or item listed after the word and equivalents thereof, but does not exclude other elements or items. The terms "connect", "couple", or "link" and the like, are not limited to a physical or mechanical connection, but may include an electrical connection, whether direct or indirect. The terms "upper", "lower", "left", "right" and the like are used to indicate relative positional relationships only, which may change accordingly when the absolute position of the object being described changes.

It will be understood that when an element such as a layer, film, region, or substrate is referred to as being "on" or "under" another element, it can be "directly on" or "directly under" the other element or intermediate elements may be present.

In the description of the above-mentioned embodiments, specific features, structures, materials, or characteristics may be combined in any suitable manner in any one or more embodiments or examples.

While the foregoing is directed to specific implementations of the present disclosure, but the scope of the present disclosure is not limited thereto. In light of the foregoing technical solution, variations or substitutions that would be readily conceived by any person skilled in the art fall within the scope of the present disclosure. Therefore, the scope of the present disclosure is set forth in the appended claims.

What is claimed is:

1. A display substrate, comprising a base and a plurality of sub-pixels provided on the base, wherein the sub-pixel comprises a sub-pixel driving circuit and a light-emitting element, the sub-pixel driving circuit comprises:
   a driving transistor and a compensation transistor, the compensation transistor comprises an active layer and a gate electrode, the active layer of the compensation transistor comprises a first electrode, a second electrode, and a channel portion connecting the first electrode and the second electrode, the driving transistor comprises an active layer and a gate electrode, and the active layer of the driving transistor comprises a first electrode, a second electrode, and a channel portion connecting the first electrode and the second electrode;

the first electrode of the compensation transistor is coupled to the second electrode of the driving transistor, and the second electrode of the compensation transistor is coupled to the gate electrode of the driving transistor; the driving transistor is configured to drive the light-emitting element to emit light;

the display substrate further comprises a pixel definition layer and a plurality of shielding patterns, at least a portion of the shielding pattern is located between the pixel definition layer and the gate electrode of the compensation transistor, and an orthographic projection of the shielding pattern onto the base at least partially overlaps with an orthographic projection of a channel portion of a corresponding compensation transistor onto the base;

the display substrate further comprises a plurality of power supply lines located in a second source-drain metal layer in the display substrate; and one of the plurality of shielding patterns and a corresponding one of the plurality of power supply lines are formed as one-piece structure, and are located in the second source-drain metal layer.

2. The display substrate according to claim 1, wherein the channel portion of the compensation transistor comprises a first channel sub-portion and a second channel sub-portion; the first channel sub-portion is coupled to the second electrode of the compensation transistor; and the orthographic projection of the shielding pattern onto the base at least partially overlaps with an orthographic projection of a corresponding first channel sub-portion onto the base.

3. The display substrate according to claim 2, wherein a length of the shielding pattern in a second direction is in a range from 1 micrometer to 20 micrometers, and a length of a portion of the first channel sub-portion covered by the shielding pattern in the second direction is greater than or equal to 0.5 micrometers.

4. The display substrate according to claim 2, wherein a ratio of an area where the shielding pattern overlapping with the orthographic projection of the corresponding first channel sub-portion onto the base to an area of the first channel sub-portion is in a range from 0.025 to 1.

5. The display substrate according to claim 1, wherein the display substrate further comprises a semiconductor layer, a first conductor layer, a second conductor layer, a first source-drain metal layer, the second source-drain metal layer, and a pixel definition layer which are sequentially stacked on the base in a direction away from the base; the active layer of the compensation transistor is located in the semiconductor layer and the gate electrode of the compensation transistor is located in the first conductor layer.

6. The display substrate according to claim 5, wherein the shielding pattern is coupled to the power supply line.

7. The display substrate according to claim 6, wherein the power supply line comprises at least one portion extending in a first direction, and an orthographic projection of the at least one portion of the power supply line extending in the first direction onto the base at least partially overlaps with an orthographic projection of the channel portion of the driving transistor onto the base; the shielding pattern protrudes from the power supply line in a second direction, and the second direction intersects with the first direction.

8. The display substrate according to claim 6, wherein display substrate further comprises a plurality of screening patterns, and the screening pattern is coupled to a corresponding shielding pattern and the power supply line.

9. The display substrate according to claim 8, wherein the active layer of the compensation transistor further comprises a first channel sub-portion, a second channel sub-portion, and a channel connection portion, and the channel connection portion is coupled to the first channel sub-portion and the second channel sub-portion; and an orthographic projection of the screening pattern onto the base at least partially overlaps with an orthographic projection of a corresponding channel connection portion onto the base.

10. The display substrate according to claim 9, wherein the orthographic projection of the shielding pattern onto the base at least partially overlaps with the orthographic projection of the corresponding channel connection portion onto the base.

11. The display substrate according to claim 10, wherein there is an overlapping region between the orthographic projection of the screening pattern onto the base and an orthographic projection of a corresponding shielding pattern onto the base, the shielding pattern is coupled to the shielding pattern by a via hole in the overlapping region, and at least a portion of the orthographic projection of the channel connection portion onto the base is located in the overlapping region.

12. The display substrate according to claim 8, wherein the screening pattern is located in the second conductor layer in the display substrate.

13. The display substrate according to claim 5, wherein the display substrate further comprises a plurality of first initialization signal lines, and the shielding pattern is coupled to the first initialization signal line.

14. The display substrate according to claim 13, wherein the sub-pixel driving circuit further comprises a first conductive connection portion and a first reset transistor; the first conductive connection portion is coupled to the first initialization signal line, the shielding pattern, and a first electrode of the first reset transistor; a second electrode of the first reset transistor is coupled to the gate electrode of the driving transistor.

15. The display substrate according to claim 13, wherein the active layer of the compensation transistor further comprises a first channel sub-portion, a second channel sub-portion, and a channel connection portion, and the channel connection portion is coupled to the first channel sub-portion and the second channel sub-portion; and an orthographic projection of the first initialization signal line onto the base at least partially overlaps with an orthographic projection of a corresponding channel connection portion onto the base.

16. The display substrate according to claim 15, wherein the first initialization signal line comprises a main body portion extending in a second direction and a protruding portion protruding from the main body portion in a first direction; and an orthographic projection of the protruding portion onto the base at least partially overlaps with an orthographic projection of a corresponding channel connection portion onto the base.

17. The display substrate according to claim 1, wherein the display substrate comprises the plurality of power supply lines, a plurality of light-emitting control lines, a plurality of gate lines, a plurality of data lines, a plurality of reset lines, a plurality of first initialization signal lines, and a plurality of second initialization signal lines;

the sub-pixel driving circuit further comprises: a storage capacitor, a first reset transistor, a data writing transistor, a power supply control transistor, a light-emitting control transistor, and a second reset transistor;

a gate electrode of the first reset transistor is coupled to a corresponding reset line, a first electrode of the first reset transistor is coupled to a corresponding first initialization signal line, and a second electrode of the first reset transistor is coupled to the gate electrode of the driving transistor;

a gate electrode of the data writing transistor is coupled to a corresponding gate line, a first electrode of the data writing transistor is coupled to a corresponding data line, and a second electrode of the data writing transistor is coupled to the first electrode of the driving transistor;

a gate electrode of the power supply control transistor is coupled to a corresponding light-emitting control line, a first electrode of the power supply control transistor is coupled to a corresponding power supply line, and a second electrode of the power supply control transistor is coupled to the first electrode of the driving transistor;

a gate electrode of the light-emitting control transistor is coupled to the corresponding light-emitting control line, a first electrode of the light-emitting control transistor is coupled to the second electrode of the driving transistor, and a second electrode of the light-emitting control transistor is coupled to a corresponding light-emitting element;

a gate electrode of the second reset transistor is coupled to a corresponding reset line, a first electrode of the second reset transistor is coupled to a corresponding second initialization signal line, and a second electrode of the second reset transistor is coupled to the corresponding light-emitting element; and a first plate of the storage capacitor is coupled to the gate electrode of the driving transistor, and a second plate of the storage capacitor is coupled to the corresponding power supply line.

18. A display device, comprising a display substrate, wherein, the display substrate comprises a base and a plurality of sub-pixels provided on the base, wherein the sub-pixel comprises a sub-pixel driving circuit and a light-emitting element, the sub-pixel driving circuit comprises:

a driving transistor and a compensation transistor, the compensation transistor comprises an active layer and a gate electrode, the active layer of the compensation transistor comprises a first electrode, a second electrode, and a channel portion connecting the first electrode and the second electrode, the driving transistor comprises an active layer and a gate electrode, and the active layer of the driving transistor comprises a first electrode, a second electrode, and a channel portion connecting the first electrode and the second electrode;

the first electrode of the compensation transistor is coupled to the second electrode of the driving transistor, and the second electrode of the compensation transistor is coupled to the gate electrode of the driving transistor; the driving transistor is configured to drive the light-emitting element to emit light; and the display substrate further comprises a pixel definition layer, a plurality of power supply lines, a plurality of shielding patterns and a plurality of screening patterns, at least a portion of the shielding pattern is located between the pixel definition layer and the gate electrode of the compensation transistor, and an orthographic projection of the shielding pattern onto the base at least partially overlaps with an orthographic projection of a channel portion of a corresponding compensation transistor onto the base;

one of the plurality of shielding patterns is coupled to a corresponding one of the plurality of power supply lines, and one of the plurality of screening patterns is coupled to a corresponding one of the plurality of power supply lines and to a corresponding one of the plurality of shielding patterns;

the channel portion of the compensation transistor further comprises a first channel sub-portion, a second channel sub-portion, and a channel connection portion, and the channel connection portion is coupled to the first channel sub-portion and the second channel sub-portion; and an orthographic projection of the screening pattern onto the base at least partially overlaps with an orthographic projection of a corresponding channel connection portion onto the base.

19. The display device according to claim 18, wherein the one of the plurality of shielding patterns and the corresponding one of the plurality of power supply lines are formed as one-piece structure, and are located in the same layer which is different from a layer where the plurality of screening patterns is located.

* * * * *